United States Patent
Yamakaji

(10) Patent No.: US 7,488,075 B2
(45) Date of Patent: Feb. 10, 2009

(54) DESIGNING METHOD OF OPTICAL SYSTEM

(75) Inventor: Tetsuma Yamakaji, Tokyo (JP)

(73) Assignee: Hoya Corporation, Tokyo (JP)

( * ) Notice: Subject to any disclaimer, the term of this patent is extended or adjusted under 35 U.S.C. 154(b) by 766 days.

(21) Appl. No.: 10/485,077

(22) PCT Filed: Aug. 19, 2003

(86) PCT No.: PCT/JP03/10437

§ 371 (c)(1),
(2), (4) Date: Feb. 24, 2004

(87) PCT Pub. No.: WO2004/018988

PCT Pub. Date: Mar. 4, 2004

(65) Prior Publication Data

US 2004/0179168 A1 Sep. 16, 2004

(30) Foreign Application Priority Data

Aug. 20, 2002 (JP) .............................. 2002-239739

(51) Int. Cl.
*A61B 3/00* (2006.01)
*A61B 3/10* (2006.01)

(52) U.S. Cl. ....................... 351/246; 351/205

(58) Field of Classification Search ................. 351/159, 351/169, 176, 177, 205, 246
See application file for complete search history.

(56) References Cited

U.S. PATENT DOCUMENTS 5,180,389 A * 1/1993 Donn et al. ................. 623/6.35
6,811,260 B2 * 11/2004 Yamakaji ..................... 351/177
2002/0071096 A1 * 6/2002 Akiyama et al. ............ 351/205

FOREIGN PATENT DOCUMENTS

| EP | 1 199 553 A2 | 4/2002 |
|---|---|---|
| JP | 42-9416 | 5/1942 |
| JP | A 57-10112 | 1/1982 |
| JP | A 58-24112 | 2/1983 |
| JP | A 2-38930 | 2/1990 |
| JP | A-08-266472 | 10/1996 |
| JP | A-2002-122828 | 4/2002 |

(Continued)

OTHER PUBLICATIONS

Kazu Miyake, "*Futatabi kakubairitsu nitsuite* (On Angle Magnification Again)," *Kohgaku* (Optics) vol. 19, No. 10.

(Continued)

*Primary Examiner*—M. Hasan
(74) *Attorney, Agent, or Firm*—Oliff & Berridge, PLC

(57) ABSTRACT

An evaluation of an optical system with respect to visual acuity is appropriately performed, with a chromatic aberration of magnification of the optical system being taken into consideration. A performance of the optical system is evaluated based on a correlation between a visual acuity when looking through the optical system and the chromatic aberration of magnification of the optical system, the correlation being a proportional relation such that, when the visual acuity is expressed by a logarithmic visual acuity, the logarithmic visual acuity deteriorates substantially in proportion to the chromatic aberration of magnification, or on a correlation between the visual acuity and an optical value regarding the chromatic aberration of magnification which is substantially equivalent to the correlation.

17 Claims, 12 Drawing Sheets

FOREIGN PATENT DOCUMENTS

| | | |
|---|---|---|
| WO | WO 00/62116 | 10/2000 |
| WO | WO 02/088828 A1 | 11/2002 |

OTHER PUBLICATIONS

Tastuteru Ryu et al., "*Kussetsuritsu bunpu suishoutai niyoru hito mokeigan* (Human eyeball model with gradient index crystalline lens)," *Kohgaku* (Optics), 30(6): 407-413, 2001.

Mitsuo Ikeda, " *Shikisai kohgaku no kiso* (Fundamentals of Color Optics)," (Asakura Shoten, 1980).

Mitsuo Ikeda, "*Shikaku no shinri butsurigaku* (Psychophysics of Vision)," (Morikita Shuppan, 1975).

Kazuhiko Ukai, " *Iroshuusa to megane* (Chromatic Aberrations and Spectacles)," (*Megane no kagaku* (Science of Spectacles), vol. 2, 23-49, 1978).

Peters et al., "The Relationship Between Refractive Error And Visual Acuity at Three Age Levels," Am. J. Optom. Physiol. Opt., 38: 194-198, 1961.

Sloan, "Opthalmological Reviews, Measurement of visual acuity: a critical review," A.M.A. Arch. Ophthal (45(6): 704-725, 1951)).

Kazuhiko Ukai et al., "*Megane renzu no shikishiuusa to shikinou ni oyobosu eikyou* (the effects of spectacle lenses on chromatic aberration and visual performance)," (Kohgaku (Optics), 7(1): 21-28, 1977).

* cited by examiner

DESIGNING METHOD OF OPTICAL SYSTEM

TECHNICAL FIELD

The present invention relates to a performance evaluation method of an optical system such as a lens or the like, a designing method of an optical system using the evaluation method, and an optical system manufactured by the designing method.

BACKGROUND ART

For designing a spectacle lens, it is performed to obtain by calculation a lens form which makes its optical performance as optimum as possible, within a range which satisfies a previously determined specification of the spectacle lens. As the specification of the spectacle lens, constraint conditions regarding the material, the prescription, or the like of the lens are given. In the case of a positive lens, a constraint condition on the center thickness of the lens is given as a further additional specification. Then, the designing of the spectacle lens is carried out while evaluating the optical performance of the lens using a predetermined function. Such a function is referred to as an evaluation function.

Specifically, a parameter which defines the spectacle lens is categorized in advance into a fixed parameter and a variable parameter. The fixed parameter is a constraint condition. Main items related to the optical lens design include a lens physicality/form factor (refractive power, Abbe number, specific gravity, lens surface form data, and the like), a prescription and fitting state related factor (lens diopter, astigmatic axis, addition, prism, base position, decentration, outside diameter, far vision PD, near vision PD, lens thickness, VR value (CR value+VC value)), an optical factor (diopter data of near vision, far vision, and the like) and other edging specific data. There may also be a case in which frame data (form, DBL, FPD, frame curve, and the like), a frame forward tilt angle, a bevel type and the like are added to design the lens. Then, first, a ray tracing method, a wave front tracing method or the like is used to set plural evaluation points having different lengths from an optical axis on a refractive surface of the spectacle lens. Next, while changing the value of the variable parameter by predetermined steps, a virtual spectacle lens, which is defined by a value of the variable parameter at this moment and a value of the fixed parameter, is assumed in each step.

Then, an evaluation value of the whole lens is obtained from values of the evaluation function at respective evaluation points of the virtual spectacle lens. Note that a function which defines an evaluation value of the whole lens using values of an evaluation function at respective evaluation points is referred to as a merit function. Then, the value of the variable parameter in a step in which the evaluation value becomes an optimum value is specified. In a preferable case, the merit function becomes an extremal value within a range which satisfies a specification. Accordingly, all the parameters which define the spectacle lens are obtained, and the lens is specified as a result.

A calculation which specifies the optimum value of the variable parameter as described above is referred to as an optimization calculation. At this time, it is preferred to use a method such as a damped least square method or the like. According to this method, the value of the variable parameter is efficiently specified by the least calculation amount. Such a calculation method is referred to as a least calculation. (For example, International Publication WO 00/62116, Japanese Examined Patent Publication No. Hei 02-38930, or the like.)

The inventor found the following problems in prior arts. Specifically, conventional evaluation functions (merit functions) are intended to evaluate optical performance of a spectacle lens by an aberration amount or the like of the lens itself. However, since the spectacle lens is essentially for visual acuity correction, the degree of deterioration of the visual acuity due to the aberration is more important than the aberration amount itself. It is thus preferable to implement not a simple evaluation function, but a kind of an evaluation function with respect to the visual acuity, namely, a function which prescribes a relation between the visual acuity while looking through an optical system and the aberration or the like of the optical system. Hereinafter, such a function is particularly referred to as a "visual acuity function." Regarding the relation between the visual acuity and the aberration, a prior art 1 (Sloan, Louise, "Measurement of visual acuity: a critical review, A. M. A. Arch. Ophthal" (45(6): 704-725, 1951)) is known. In this document, an equation I is given as a visual acuity deteriorating part of a minimum separation threshold.

$$2.8[\text{sphere error}+0.8(\text{cyl error})] \qquad \text{equation I}$$

In this equation I, it is defined that the sphere error=min (|T|, |S|), the cyl error=||T|−|S||, where T is a tangential error, and S is a sagittal error.

However, in this document, there are three problems as follows.
1. It does not refer to the chromatic aberration.
2. It does not refer to an eyeball motion (Listing's Law) of an astigmatic eye.
3. The "sphere error" and the "cyl error" are measured separately, but a visual acuity deterioration due to an interrelation between the "sphere error" and the "cyl error" is not measured.

Therefore, visual acuity deterioration data in which the "sphere error" and the "cyl error" are combined are unreliable, and a tentative theory of presumption is unconvincing.

Further, in Japanese Patent Laid-open No. Sho 58-24112, the following definition of a visual acuity V is disclosed.

$$V = 2^{-2 \cdot \overline{\Delta R} - \overline{\Delta S}} \qquad \text{equation VI}$$

Here, ΔR and ΔS are synonyms of the "sphere error" and the "cyl error" respectively in the equation I in the above-described prior art 1. Specifically, they are defined as ΔR=min (|S|, |T|), and ΔS=||S|−|T||.

In this publication, similarly to the above-described prior art 1, there is no reference to the chromatic aberration and the eyeball motion of an astigmatic eye. Further, it does not disclose any theory or reason (measured data or the like) as a basis to derive the equation of the visual acuity V, so that it is theoretically unreliable and unpractical.

Thus, it is a difficult problem to faithfully express the visual acuity using the aberration or the like. In other words, when it is tried to faithfully express the visual acuity, other biophenomena such as the eyeball motion and the like should be taken into consideration.

Further, among various kinds of aberrations, especially a relation between the chromatic aberration and the visual acuity is not ascertained yet.

For example, in Japanese Examined Patent Publication No. Sho 42-9416, a part of the above described equation I is defined as a Blur Index, and the "sphere error" and the "cyl error" to which the chromatic aberration is added are respec tively defined as follows. Further, the relation of the Blue Index with fraction visual acuity V is shown by the following equation II to equation V.

$$\text{Blur Index} = \text{sphere error} + 0.8 \text{ (cyl error)} \quad \text{equation II}$$

$$\text{sphere error} = \frac{|T|+|C|+|S|}{2} - \frac{|T|+|C|-|S|}{2} \quad \text{equation III}$$

$$\text{cyl error} = \||T|+|C|-|S|\| \quad \text{equation IV}$$

$$V = \frac{20}{20 + 56 \times \text{Blur Index}} \quad \text{equation V}$$

Here, C is a chromatic aberration of magnification (transverse chromatic aberration), and is a value obtained by dividing a prism diopter of a deviation angle of a ray which penetrates a lens by an Abbe number. However, in this description, the tangential error is a function of pupil diameter, and although the chromatic aberration of magnification is mentioned to be irrelevant to this pupil diameter and the unit is actually different, the tangential error and the chromatic aberration of magnification are treated equally. In other words, one diopter of the tangential error and one prism diopter of the chromatic aberration of magnification are treated as equal amount of information, which are considered to respectively cause an equal amount of the deterioration of visual acuity.

This tentative theory has no reason based on any scientific data and cannot be verified, and the conclusion therein is also unconvincing. Further, it does not mention about consideration of the eyeball motion (Listing's Law) in calculation of an astigmatic diopter error.

Therefore, it is unusable for progressive lenses, atoric lenses or the like.

On the other hand, it is well known that the chromatic aberration is preferred to be small for visual acuity, and there is a few scientific study examples of an effect of the chromatic aberration on visual performance. Refer to "Kazuhiko Ukai, Hitoshi Ozu, Kaoru Nakajima, Osamu Shindo: *Megane renzu no shikishuusa to shikinou ni oyobosu eikyou* (the effects of spectacle lenses on chromatic aberration and visual performance) (KOHGAKU (Optics), 7(1): 21-28, 1977)," (hereinafter referred to as document 1).

However, the present situation is that, as described above, the relation of the both is not clearly understood to such a degree that at least it can be applied to designing of an actual optical system. In addition, it is considerable to ignore the chromatic aberration for simplification and define the visual acuity function with a focus only on aberrations other than the chromatic aberration. However, since it cannot be clearly said that there is no causal relation between the chromatic aberration and the visual acuity deterioration, it is hard to say that the visual acuity function ignoring the chromatic aberration is accurate.

Incidentally, the chromatic aberration has been ignored in optimization calculation in designing spectacle lenses. In other words, among conventional simple evaluation functions which are not the visual acuity function, there is no evaluation function which handles the chromatic aberration substantially as a variable parameter. It is conceivable, first, to be caused by that a selection range of an Abbe number which is closely correlated to the chromatic aberration is limited from the beginning to a certain degree in relation to the materials. Specifically, the degree of freedom of the Abbe number is smaller as compared to degrees of freedom of other factors. Therefore, in designing of optical systems, the Abbe number is not a variable parameter, but is fixed as a constraint condition (specification).

Also it is conceivable, second, to be caused by a recognition that imaging characteristics of a white light and a monochromatic light in an eyeball optical system are barely different. For more details about this, refer to the following document: "G. A. Fry: Progress in Optics, Vol VIII, p112, ed. by E. Wolf, North-Holland Publishing Company, Amsterdam 1970" (hereinafter referred to as document 2), "KrausKopf J.: J. Opt. Soc. Amer., 52, 1046-1050 (1962) (hereinafter referred to as document 3), and "KrausKopf J.: J. Opt. Soc. Amer., 54, 715-716 (1964) (hereinafter referred to as document 4)."

This fact suggests at the same time that even if the Abbe number is sacrificed to a certain extent, a lens having a light weight and a good appearance which is made of a material having a high refractive power can increase the customer satisfaction more.

However, in the study of the inventor, it is proved that the evaluation or the design of optical systems based only on aberrations other than the chromatic aberration of magnification is entirely insufficient.

An object of the present invention is to provide a technique to properly perform evaluation of an optical system with respect to visual acuity in light of the chromatic aberration of magnification of the optical system. A further object of the present invention is to provide a technique to properly design an optical system in light of the chromatic aberration of magnification of the optical system.

DISCLOSURE OF THE INVENTION

According to a first aspect of the present invention, a performance evaluation method of an optical system is provided, which comprises an optical performance evaluation step for evaluating a performance of the optical system based on a correlation between a visual acuity when looking through the optical system and a chromatic aberration of magnification of the optical system, the correlation being a proportional relation such that, when the visual acuity is expressed by a logarithmic visual acuity, the logarithmic visual acuity deteriorates substantially in proportion to the chromatic aberration of magnification, or on a correlation between the visual acuity and an optical value regarding the chromatic aberration of magnification which is substantially equivalent to the correlation.

The logarithmic visual acuity mentioned here refers particularly to, among expression types of visual acuity, a type of visual acuity which is represented by logarithms. The logarithmic visual acuity includes the following for example:

logarithmic visual acuity of logMAR unit=$\log_{10}(1/V)$ logarithmic visual acuity of Nakagawa type=$50 \times \log_{10} V + 100$ logarithmic visual acuity of AGO unit=$4 \times \log_2 2^{10} V$ Here, V is the inverse number of a minimum angular resolution (MAR) which is a minimum visual angle capable of recognizing two points or two lines. In addition, the inverse number V of the minimum angular resolution is equivalent to decimal visual acuity, fraction visual acuity, or the like. Hereinafter, the logarithmic visual acuity in logMAR unit is referred to as "logMAR visual acuity."

The correlation refers to a correlation between the visual acuity as a concept including the logarithmic visual acuity, the decimal visual acuity, and the like and the chromatic aberration of magnification, and thus it is not particularly limited to the substantially proportional relation between the logarithmic visual acuity and the chromatic aberration of magnification. Therefore, it includes all correlations which are substantially equivalent to such a substantially proportional relation.

For example, a conversion of the substantially proportional relation between the logMAR visual acuity ($=\log_{10}(1/V)$) and the chromatic aberration of magnification into a correlation between the decimal visual acuity V and the chromatic aberration of magnification provides the following result. Specifically, since the deterioration of the logMAR visual acuity indicates the increase of its value:

$$\log_{10}(1/V) \propto \text{chromatic aberration of magnification}$$

this relation is expressed for convenience as:

$$\log_{10}(1/V) = \beta \times \text{chromatic aberration of magnification}$$

then it becomes:

$$\log_{10} V = -(\beta \times \text{chromatic aberration of magnification})$$

therefore:

$$V = 10^{-(\beta \times \text{chromatic aberration of magnification})}$$

In other words, the decimal visual acuity V deteriorates (decreases) exponentially with the increase of the chromatic aberration of magnification. Such an exponential relation is also substantially equivalent to the above-described proportional relation.

Further, the optical value regarding the chromatic aberration of magnification includes, for example, an Abbe number of the optical system, a prism diopter, and the like.

According to a second aspect of the present invention, a performance evaluation method of an optical system is provided, which comprises an optical performance evaluation step for evaluating a performance of the optical system based on a combination principle, the combination principle of both a first deterioration amount and a second deterioration amount when expressing a total deterioration amount due to aberrations of a visual acuity in an optical system when looking through the optical system, using the first deterioration amount only due to an aberration other than a chromatic aberration of magnification among the aberrations and the second deterioration amount only due to the chromatic aberration of magnification among the aberrations, the combination principle in which, when the visual acuity is expressed by a logarithmic visual acuity, the total deterioration amount of the logarithmic visual acuity becomes a sum of the first deterioration amount and the second deterioration amount.

Here, the combination principle refers to a combination principle for expressing the total deterioration amount due to aberrations of visual acuity which is a concept including the logarithmic visual acuity, the decimal visual acuity, and the like, using the first deterioration amount and the second deterioration amount, and thus it is not particularly limited to the relation of the sum when expressing by the logarithmic visual acuity.

For example, a conversion of the combination principle expressed by logMAR visual acuity ($=\log_{10}(1/V)$) into the combination principle expressed by decimal visual acuity V provides the following result. Specifically, the deterioration of the logMAR visual acuity indicates the increase of its value, so that it is expressed for convenience as follows:

$$\log_{10}(1/V) = \text{first deterioration amount} + \text{second deterioration amount then it becomes:}$$

$$\log_{10} V = -(\text{first deterioration amount} + \text{second deterioration amount})$$

therefore, the combination principle becomes:

$$V = 10^{-(\text{first deterioration amount} + \text{second deterioration amount})}$$

$$V = 10^{-\text{first deterioration amount}} \times 10^{-\text{second deterioration amount}}$$

Such a combination principle is also substantially equivalent to the above-described relation of the sum.

In addition, the optical system according to the present invention refers to an optical system intervening between the crystalline lens of an eye and a visual object. In other words, it refers to all optical systems which are coherently coupled to the crystalline lens of an eye. Such an optical system includes, for example, spectacle lenses, contact lenses, intraocular lenses, head mount displays (HMDs), telescopes, binoculars, microscopes, and the like.

According to a third aspect of the present invention, a performance evaluation method of an optical system is provided, in which, in the optical performance evaluation step in the second aspect, the performance of the optical system is evaluated using a visual acuity function which is composed to define a value of the visual acuity from the total deterioration amount of the visual acuity by combining a first term for obtaining the first deterioration amount and a second term for obtaining the second deterioration amount in accordance with the combination principle.

Here, the first term is preferred to be composed including a parameter expressing a power error (also referred to as a curvature of field or a mean power error), and a parameter representing an astigmatism or a residual astigmatism.

Preferably, the first term is composed, when the optical system is formed of a spherical lens, including the parameter expressing the power error and the parameter expressing the astigmatism, and the first term is composed, when the optical system is formed of an aspherical lens, including the parameter expressing the power error and the parameter expressing the residual astigmatism.

Here, the residual astigmatism refers to a sum of the astigmatism in a coordinate system of an eyeball which performed a cycloduction based on the Listing's law, and the astigmatism generated by the optical system.

The reason for selecting the power error and the astigmatism or the residual astigmatism as the aberration other than the chromatic aberration of magnification is, first, these aberrations affects visual acuity even when a pupil diameter is small. Second, a good visual acuity is provided by approximately two degree including the fovea on a retina. Third, since a good visual acuity is in the vicinity of an optical axis due to a Stiles-Crawford effect or the like, a spherical aberration and a coma aberration do not largely affect the visual acuity.

Any of these three reasons suggest the existence, in the visual acuity, of a visual system which counterbalances the spherical aberration of narrow definition which affects the pupil diameter, and an axial chromatic aberration. Refer to "Mitsuo Ikeda: *Shikaku no shinri butsurigaku* (Psychophysics of Vision) (Morikita Shuppan, 1975)," (hereinafter referred to as document 5), and "Mitsuo Ikeda: *Shikisai*

*kohgaku no kiso* (Fundamentals of Color Optics) (Asakura Shoten, 1980)," (hereinafter referred to as document 6).

[Relation Between the Chromatic Aberration and the Visual Acuity]

As a result of dedicated studies, the inventor has found first that there is a substantially linear relation between a logMAR visual acuity when looking through an optical system and the chromatic aberration of magnification of the optical system. It will be explained in detail below.

The chromatic aberration includes the axial chromatic aberration and the chromatic aberration of magnification. Between them, it has been reported that the axial chromatic aberration does not affect visual acuity. Refer to the above-described document 1 and "Kazuhiko Ukai: *Iroshuusa to megane* (Chromatic Aberrations and Spectacles) (*Megane no kagaku* (Science of Spectacles), vol. 2, 23-49, 1978)," (hereinafter referred to as document 7).

Accordingly, the inventor studied the relation between the chromatic aberration of magnification and the visual acuity. Unfortunately, there is no good measurement example of visual acuity deterioration under a condition that the visual acuity is only affected by the chromatic aberration of magnification. Consequently, the following experiment is performed, and the relation between the chromatic aberration of magnification and the visual acuity deterioration is studied based on the obtained data from the experiment. The condition of the experiment is shown in FIG. 1. The experiment method is as follows.

(a) A subject is set down on a chair, and an international type visual acuity chart 1 is placed at 5 [m] apart therefrom. Then, visual acuity of the subject is measured by the subjective refraction of fogging method. However, the brightness of the room is adjusted to 500 [1x].

(b) Concretely, each of 7 subjects are measured of their naked eye vision of left and right eyes separately. Further, visual acuity of both eyes are measured by subjective refraction.

(c) Next, corrected vision of left and right eyes are separately measured by the similar subjective refraction, and the corrected vision of both eyes are measured until the maximum value of being capable to see.

(d) Next, as a prism 2, four groups of five types of prisms respectively having prism values of $10^\Delta$, $8^\Delta$, $6^\Delta$, $4^\Delta$, $2^\Delta$ are prepared, each of the groups having a different Abbe number. Then, these prisms are placed in front of a spectacle lens 3 in turn from the one having the largest diopter to measure the visual acuity. A trial frame is used for the placement of the prism 2.

Refractive indexes and the Abbe numbers of the prisms used for this experiment are shown in Table 1.

TABLE 1

| Refractive indexes (d line) | Abbe number (d line) |
|---|---|
| 1.806 | 40.9 |
| 1.702 | 40.2 |
| 1.523 | 59.2 |
| 1.700 | 31.0 |

Further, the naked eye vision, the corrected vision, and the experimented visual acuity measurement values of each of the seven subjects (denoted by No. 1 to No. 7) are respectively shown in Table 2 to Table 8. In the tables, R denotes a right eye, L denotes a left eye, and B denotes both eyes.

TABLE 2

No. 1 27 years old Male

| | R | L | B |
|---|---|---|---|
| Naked eye vision | 0.9 | 0.7 | 1.0 |
| Corrected vision | 1.0 | 1.0 | 1.2 |

| | $v_d = 59.2$ | $v_d = 40.9$ | $v_d = 40.2$ | $v_d = 31.0$ |
|---|---|---|---|---|
| $2^\Delta$ | 1.2 | 1.0 p | 1.0 p | 1.0 p |
| $4^\Delta$ | 1.0 p | 1.0 p | 1.0 p | 1.0 p |
| $6^\Delta$ | 1.0 p | 1.0 p | 1.0 p | 1.0 |
| $8^\Delta$ | 1.0 | 1.0 | 1.0 | 0.9 |
| $10^\Delta$ | 1.0 | 0.9 | 0.9 p | 0.7 p |

TABLE 3

No. 2 24 years old Male

| | R | L | B |
|---|---|---|---|
| Naked eye vision | 2.0 | 1.2 | 2.0 |
| Corrected vision | 1.5 | 1.5 | 2.0 |

| | $v_d = 59.2$ | $v_d = 40.9$ | $v_d = 40.2$ | $v_d = 31.0$ |
|---|---|---|---|---|
| $2^\Delta$ | 1.5 p | 1.5 p | 1.5 p | 1.5 p |
| $4^\Delta$ | 1.5 | 1.5 p | 1.5 p | 1.5 p |
| $6^\Delta$ | 1.2 p | 1.5 | 1.2 p | 1.2 p |
| $8^\Delta$ | 1.2 p | 1.2 p | 1.0 p | 1.0 p |
| $10^\Delta$ | 1.2 | 1.2 | 1.0 | 0.9 |

TABLE 4

No. 3 38 years old Male

| | R | L | B |
|---|---|---|---|
| Naked eye vision | 0.3 | 0.5 | 0.5 |
| Corrected vision | 1.2 | 1.2 | 1.5 |

| | $v_d = 59.2$ | $v_d = 40.9$ | $v_d = 40.2$ | $v_d = 31.0$ |
|---|---|---|---|---|
| $2^\Delta$ | 1.5 | 1.5 | 1.5 | 1.5 |
| $4^\Delta$ | 1.5 | 1.5 | 1.5 | 1.2 |
| $6^\Delta$ | 1.5 | 1.5 | 1.2 p | 1.2 |
| $8^\Delta$ | 1.5 | 1.2 p | 1.2 p | 1.0 p |
| $10^\Delta$ | 1.2 | 1.2 | 1.2 | 1.0 |

TABLE 5

No. 4 50 years old Male

| | R | L | B |
|---|---|---|---|
| Naked eye vision | 1.2 | 1.2 | 1.5 |
| Corrected vision | 1.2 | 1.2 | 1.5 |

| | $v_d = 59.2$ | $v_d = 40.9$ | $v_d = 40.2$ | $v_d = 31.0$ |
|---|---|---|---|---|
| $2^\Delta$ | 1.5 | 1.5 | 1.5 | 1.5 |
| $4^\Delta$ | 1.5 | 1.5 | 1.2 p | 1.2 p |
| $6^\Delta$ | 1.2 p | 1.5 | 1.2 p | 1.2 |
| $8^\Delta$ | 1.2 | 1.0 p | 1.2 | 1.0 |
| $10^\Delta$ | 1.0 | 1.0 | 1.0 | 0.8 |

TABLE 6

No. 5 36 years old Male

| | R | L | B |
|---|---|---|---|
| Naked eye vision | 1.2 | 0.6 | 1.2 |
| Corrected vision | 1.2 | 1.2 | 1.5 |
| | $v_d = 59.2$ | $v_d = 40.9$ | $v_d = 40.2$ | $v_d = 31.0$ |
| $2^\Delta$ | 1.5 | 1.5 | 1.5 | 1.5 |
| $4^\Delta$ | 1.5 | 1.5 | 1.5 | 1.2 p |
| $6^\Delta$ | 1.5 | 1.5 | 1.5 | 1.2 p |
| $8^\Delta$ | 1.5 | 1.5 | 1.2 p | 1.0 p |
| $10^\Delta$ | 1.2 | 1.2 | 1.2 | 1.0 |

TABLE 7

No. 6 36 years old Male

| | R | L | B |
|---|---|---|---|
| Naked eye vision | Using Spectacles | Using Spectacles | Using Spectacle |
| Corrected vision | 1.5 | 1.2 | 1.5 |
| | $v_d = 59.2$ | $v_d = 40.9$ | $v_d = 40.2$ | $v_d = 31.0$ |
| $2^\Delta$ | 1.5 | 1.5 | 1.5 | 1.5 |
| $4^\Delta$ | 1.5 | 1.5 | 1.5 | 1.2 |
| $6^\Delta$ | 1.5 | 1.2 | 1.2 | 0.9 |
| $8^\Delta$ | 1.5 | 0.9 | 0.9 | 0.8 |
| $10^\Delta$ | 1.0 | 0.8 | 0.8 | 0.7 |

TABLE 8

No. 7 29 years old Male

| | R | L | B |
|---|---|---|---|
| Naked eye vision | 0.8 | 0.6 | 0.8 |
| Corrected vision | 1.2 | 1.2 | 1.5 |
| | $v_d = 59.2$ | $v_d = 40.9$ | $v_d = 40.2$ | $v_d = 31.0$ |
| $2^\Delta$ | 1.5 | 1.2 p | 1.5 | 1.5 |
| $4^\Delta$ | 1.5 | 1.2 p | 1.2 p | 1.5 |
| $6^\Delta$ | 1.2 p | 1.2 | 1.0 p | 1.5 |
| $8^\Delta$ | 1.2 | 1.0 p | 1.0 p | 1.2 p |
| $10^\Delta$ | 1.0 | 1.0 | 0.9 p | 1.0 |

In Table 2 to Table 8, visual acuity values to which a code p is added are intermediate values of the visual acuity values thereabove. Here, the reason of performing the visual acuity measurement on both eyes is to make the condition same as that while fitting spectacles. Note that lenses of the same Abbe number are normally worn on both eyes.

Then, on a plane with a coordinate system on which the logMAR visual acuity is taken on the vertical axis and the chromatic aberration of magnification is taken on the horizontal axis, the visual acuity measurement data of Table 2 to Table 8 are plotted. The result thereof is shown in FIG. 2.

Values of the horizontal axis of FIG. 2 will be explained. The values of the horizontal axis can be obtained from the Abbe numbers on Table 1 and the prism values ($10^\Delta$, $8^\Delta$, $6^\Delta$, $4^\Delta$, $2^\Delta$) shown in Table 2 to Table 8. For example, when the Abbe number $v_d$=40.2 and the prism value=$6^\Delta$, the chromatic aberration of magnification is 0.149 which is obtained by dividing $6^6$ by 40.2. In other words, the unit of the chromatic aberration of magnification is prism diopter/Abbe number.

Note that, in FIG. 2, the chromatic aberration of magnification is a measurement result on a "d" line. However, also on an "e" line, the prism value increases by approximately the same ratio by which the Abbe number increases. Therefore, the value of the chromatic aberration of magnification in the case of the "e" line is substantially the same value as the above-described value, so that it does not affect the description hereafter.

Next, values of the vertical axis of FIG. 2 will be explained. Each of the seven subjects has different corrected vision. Accordingly, the corrected vision (in unit of decimal visual acuity) of all the subjects are normalized to 1.0. By this normalization, the effect of dispersion due to visual acuity measurement conditions (for example, brightness of a visual acuity chart, precision of a measured distance, and the like) is largely reduced. Then, the normalized values thereof are converted to logMAR visual acuity.

The reason of expressing the visual acuity by the [logMAR] unit is based on a fact that most of biophenomena can be expressed using logarithms. In other words, as compared to the decimal visual acuity and the fraction visual acuity, the logarithmic visual acuity expresses the biophenomena more faithfully. Note that the conversion from the decimal visual acuity to the logMAR visual acuity can be performed by the following equation.

logMAR visual acuity=$\log_{10}$(1/decimal visual acuity)

From the plots of FIG. 2, the following facts are perceived.

(1) It is found that there is a linear correlation between the chromatic aberration of magnification and the logMAR visual acuity for all the subjects of No. 1 to No. 7. Since the logMAR visual acuity generally gets larger as the visual acuity gets lower, FIG. 2 shows that the logMAR visual acuity deteriorates in proportion to the increase of the chromatic aberration of magnification. Incidentally, in FIG. 2, to make the linear correlation easily understandable, approximation straight lines are added on the plots showing the visual acuity deteriorations of the subjects No. 2 and No. 3.

The plots of the normalized logMAR visual acuity and the chromatic aberration of magnification as shown in FIG. 2 are attempted first by the inventor. The inventor has found from consideration of these plots that the deterioration of the logMAR visual acuity due to the chromatic aberration is substantially proportional to the chromatic aberration of magnification.

(2) The correlation between the chromatic aberration of magnification and the logMAR visual acuity is largely different among individuals. From this fact, it is considerable that the correlation is related to the naked eye vision. Correction lenses for hypermetropic subjects are positive, so that they are more strongly affected by the chromatic aberration as compared to myopic subjects. In other words, the hypermetropic subjects (No. 2, No. 6) are more strongly affected by the chromatic aberration as compared to the myopic subject (No. 3). As reasons thereof, first, since hypermetropic spectacles and myopic spectacles are both worn for the measurement, an effect of the chromatic aberration due to the difference of the spectacles is conceivable. Second, an effect of the chromatic aberration due to the difference between hypermetropic eyes and myopic eyes is conceivable. However, there remains a problem that the number of subjects is small.

(3) Due to a small field tritanopia phenomenon, the minimum visual angle for perception of yellow and blue is defined as 13 [arc minutes], and that of red and green as 8 [arc minutes] (Incidentally, the "small field tritanopia" is an ophthalmological term. Refer to the above-described document 6). Consequently, the chromatic aberration of magnification by which blurs of colors are not recognized becomes approximately $0.2^\Delta$ or lower. However, as shown in FIG. 2, although colors are not seen, the deterioration of the logMAR visual acuity linearly occurs in a range equal to or lower than the chromatic aberration of magnification of $0.2^\Delta$. From this experiment, the inventor has found first that, even when colors are not seen, the proportional relation between the logMAR visual acuity and the chromatic aberration of magnification continues until the chromatic aberration of magnification becomes zero.

From an analysis of the experiment data as above, the deterioration of the visual acuity (logMAR visual acuity) due to the chromatic aberration of magnification becomes apparent.

Incidentally, it is useful to be capable of combining the visual acuity function not by visual acuity measurement, but by calculation based on eyeball models. However, at the present time, there is no suitable model for evaluating imaging characteristics of eyeball optics, and it is commonly believed that no appropriate model is known for quantitatively obtaining a chromatic dispersion. (Refer to "Tastuteru Ryu, Hisayuki Kato, Hitoshi Ozu: *Kussetsuritsu bunpu suishoutai niyoru hito mokeigan* (Human eyeball model with gradient index crystalline lens), *KOHGAKU* (Optics), 30(6): 407-413, 2001" (hereinafter referred to as document 8).) Further, in view of precision or the like, it is difficult to make a total visual model for visual acuity calculation including processing of the retina and processing in the brain. Therefore, the present invention adopts a technique to define the visual acuity function based on actual measured visual data.

[Relation Between the Chromatic Aberration of Magnification, Aberrations other than the Chromatic Aberration, and Visual Acuity]

As above, it is proved that the visual acuity deteriorates due to the chromatic aberration of magnification. Next, it will be explained how to combine this deterioration with a deterioration due to aberrations other than the chromatic aberration of magnification. As for the combination principle, the experiment data in the above-described document 1 is reviewed, a part of the data being re-adjusted while new data being added, and a novel conclusion is thereby found.

First, the experiment described in the above-mentioned document 1 will be explained. In the document 1, as shown in FIG. 3, MTF measurement is carried out while fitting spectacles and side directional vision. As a spectacle lens 4, four types of lenses (No. 1 to No. 4) respectively having a different Abbe number are used.

Note that the MTF (Modulation Transfer Function) expresses what kind of optical performance an optical system such as a lens has by a spatial frequency. The MTF is a suitable method to quantitatively express the quality of an image reaching from an object (a moire pattern (stripe) in this case) to the final process (an eye in this case).

The conditions of the experiment are shown in the document 1 as follows.

(1) As shown in FIG. 3, a mask 5 having a circular opening 51 with 8 [mm] diameter is placed on a position 42 which is 20 [mm] aside from the center position 41 on an surface of the spectacle lens 4, and the MTF measurement is carried out.

(2) The visual field is a circular shape, and the visual angle is 4°.

(3) The diopter of the lens used is −6.50 [D].

(4) The distance from a rear vertex of the lens to the center of rotation is 25 [mm].

(5) The subject is 26 years old, myopic, and having a corrected vision of 1.0.

(6) A moire pattern presentation device 6 is used to perform the MTF measurement while changing a spatial frequency of the pattern.

The measurement results of the document 1 are the only publicly known data under a condition that the visual acuity deterioration due to the chromatic aberration of magnification and the visual acuity deterioration due to aberrations (a power error, an astigmatism) which affect the visual acuity other than the chromatic aberration of magnification are combined. Refractive indexes and Abbe numbers of the lens 4 used in this experiment are shown in Table 9.

TABLE 9

|  | Refractive index (d line) | Abbe number (d line) |
|---|---|---|
| No. 1 | 1.7020 | 29.8 |
| No. 2 | 1.7015 | 41.1 |
| No. 3 | 1.7000 | 48.1 |
| No. 4 | 1.6968 | 55.5 |

As shown in FIG. 9, for all the lenses of No. 1 to No. 4, the refractive indexes are defined so as to have an average value of 1.700. Accordingly, visual acuity deteriorations due to the refractive indexes become substantially the same for all the lenses. Then, changes of visual acuity deterioration only due to the Abbe numbers are obtained by the experiment. The results of the visual acuity measurement are shown in FIG. 10 of the document 1, which is shown in FIG. 4 as a reference. FIG. 4 is a graph on which cut-off frequencies are taken on the vertical axis, and the inverse numbers of the Abbe numbers are taken on the horizontal axis.

In order to make visual acuity deterioration data of FIG. 4 comparable with visual acuity deterioration data only due to the chromatic aberration of magnification, the data of FIG. 4 are re-plotted and adjusted to be the same format as FIG. 2 so that a relation between the visual acuity and the chromatic aberration of magnification can be easily associated. The method of re-plotting is as follows.

Values for the vertical axis are obtained as follows. First, from FIG. 4, cut-off frequency data at the lens center 41 and at the position 42 which is 20 [mm] aside from the center are precisely read. Then, in order to make the cut-off frequency data at the center of the lenses No. 1 to No. 4 become zero for logMAR visual acuity, the cut-off frequency data at the position 42 which is 20 [mm] aside from the center are normalized to visual acuity deterioration data in logMAR unit. By this normalization, contributing factors for errors such as mechanic myopia, index luminance, index distance and the like under the conditions of the experiment are largely reduced. The values of the vertical axis are thus obtained.

Values for the horizontal axis are obtained as follows. First, the inverse numbers $(1/\upsilon d)$ of the Abbe numbers which are the horizontal axis of FIG. 4 are converted to the prism value/Abbe number, which is the unit of the chromatic aberration of magnification. However, prism data of the lens opening at the position 42 which is 20 [mm] aside from the center are not described in the document 1. Further, although form data of the spectacle lens 4 used in the experiment are needed in order to obtain the prism data by calculation, the form data are not described in the document 1.

Accordingly, the prism value at the position 42 which is 20 [mm] aside from the center of the spectacle lens 4 used in the experiment is estimated. For this purpose, the following factors are presumed.

(1) First, the spectacle lens at the time the experiment was performed is a spherical lens.

(2) Second, even when the form of the spectacle lens used for the experiment is presumed to be the same form as a form of spectacle lens made of glass having a refractive index of 1.702 which is sold at the time, the deviation angle and the prism value of a ray at the position which is 20 [mm] aside from the lens center has substantially no influence on the description herein. The reason thereof is that the prism value at a position apart from the center of a lens does not largely change due to its lens form. This is based on Prentice's formula which presents that the prism value at a position which is apart from the center of a lens is approximately proportional to the diopter at the center of the lens and a distance from the center to the position.

(3) Further, even when all the refractive indexes are presumed to be 1.700, regarding the diopter at the center of a lens, the spectacle lenses No. 1 to No. 4 have errors at the central diopter of approximately 0.01 [D], which are not essentially different.

Here, the lens form data are presumed and shown in Table 10.

TABLE 10

| | |
|---|---|
| Lens refractive index (d line) | 1.700 |
| Distance from rear vertex to center of rotation (mm) | 25 |
| Lens diopter (D) | −6.50 |
| Lens form | Spherical on front surface and rear surface |
| Lens front surface curvature (1/mm) | 0.00609259 |
| Lens rear surface curvature (1/mm) | 0.01536412 |
| Lens center thickness | 0.80 |

Using the data of this table 10, the prism value (prism diopter) at the position which is 20 [mm] aside from the lens center can be calculated as shown in Table 11.

TABLE 11

| Prism (prism diopter) | 15.72$^\Delta$ |
|---|---|

Values obtained by dividing the prism diopter by the Abbe numbers of respective lenses No. 1 to No. 4 are defined as the chromatic aberration of magnification. Accordingly, the inverse numbers of the Abbe numbers which are the horizontal axis of FIG. 4 can be converted to the prism value/Abbe number, which is the regular unit of the chromatic aberration of magnification. The values for the horizontal axis are thus obtained.

Here, data obtained by re-calculating the data of FIG. 4 as described above are shown in Table 12.

The chromatic aberration of magnification in Table 12 is taken as horizontal axis values, and the logMAR visual acuity at the position 20 [mm] aside from the center is taken as vertical axis values, thereby obtaining data of the same format as FIG. 2.

[Calculation of Visual Acuity Deterioration Due to Off-Axis Aberration without Chromatic Aberration]

Incidentally, in document 1, as shown in FIG. 4, by taking the cut-off frequencies on the vertical axis and the inverse numbers of the Abbe numbers on the horizontal axis, the cut-off frequencies when the chromatic aberration does not exist are presumed, it is attempted to consider influences by the off-axis aberrations other than the chromatic aberration of magnification of a spectacle lens. However, as a result, the document 1 reaches a conclusion that the influences of the chromatic aberration and the other aberrations on a periphery of a spectacle lens are not separable only by the change of MTF.

[Consideration of Influences of the Off-Axis Aberration other than the Chromatic Aberration of a Spectacle Lens on Visual Acuity]

Accordingly, with respect to the above-described conclusion, a method of separating the chromatic aberration and the other aberrations by the following technique is found. The influences of the off-axis aberrations other than the chromatic aberration of a spectacle lens on visual acuity can be calculated by the following technique.

First, visual acuity data by actual measurement are used to newly perform an analysis in order to understand visual acuity deterioration due to the off-axis aberration other than the chromatic aberration. As a basal document to connect the actual measured value of the visual acuity and the lens aberrations other than the chromatic aberration, "Peters, Henry B., The relationship between refractive error and visual acuity at three age levels, Am. J. Optom. Physiol. Opt., 38: 194-198, 1961" (hereinafter referred to as document 9) is available. Here, regarding the aberrations other than the chromatic aberration, it is presumed that the aberrations other than the main chromatic aberrations which affect the visual acuity only include power errors and astigmatisms which are irrelevant to pupil diameters.

A view of the document 9 shows the result of visual acuity measurement of a subject who regularly uses spectacles, the measurement being carried out with the spectacles taken off. The diagram is referred herein and shown in FIG. 5. This view shows values of the visual acuity measurement in unit of decimal visual acuity, on which spherical diopters are taken on the horizontal axis and astigmatic diopters are taken on the vertical axis. Visual acuity deterioration occurs of course and the subject is not able to see very well since the spectacles are taken off. Note that, since it is the visual acuity measurement

TABLE 12

| | Abbe number | Chromatic aberration of magnification | The number of stripes at the position 20 mm aside (cycles/degree) | The number of stripes at the center (cycles/degree) | logMAR visual acuity at the position 20 mm aside |
|---|---|---|---|---|---|
| No. 1 | 29.8 | 0.527 | 23.125 | 49.375 | 0.329 |
| No. 2 | 41.1 | 0.382 | 28.125 | 48.750 | 0.239 |
| No. 3 | 48.1 | 0.327 | 32.50 | 55.00 | 0.228 |
| No. 4 | 55.5 | 0.283 | 36.25 | 53.125 | 0.166 | performed in a state that the spectacles are not worn, an axial chromatic aberration of an eyeball does not affect visual acuity as mentioned in the above-described document 1, so that the visual acuity deterioration data are not affected by the chromatic aberration.

Using these data, the visual acuity deterioration under a condition excluding the chromatic aberration is calculated. At this time, it is assumed that the visual acuity deterioration in a state that the subject is not fitting spectacles is the same as the visual acuity deterioration in a state that the subject is fitting spectacles and further looking through lenses having inverse values of spherical diopter and astigmatic diopter of the spectacle lenses.

Thus, while values of the visual acuity deterioration data of FIG. 5 are left unchanged, and when signs of the spherical diopters on the horizontal axis and the astigmatic diopters on the vertical axis are respectively inversed, the resultant data represent visual acuity deterioration in the case that an emmetropic subject is fitting spectacles having the inversed spherical diopter and astigmatic diopter.

Here, a relation between the visual acuity deterioration and the eyeball motion (Listing's Law) will be explained. The Listing's Law means that there is a rotation axis of an eyeball motion in a plain (Listing's surface) perpendicular to an eye position including a center of the cycloduction when the eyeball looks far forward (first eye position).

In the measurement of the chromatic aberration of magnification in the above-described document 1, the spherical diopter of the lens is −6.50 [D]. However, it can be generally presumed that there is an astigmatic diopter. For the case that there is an astigmatic diopter, a designing system in consideration of the Listing's Law is known (refer to Japanese Patent Laid-open No. Sho 57-10112).

However, in this publication, only an aberration derived by optical calculation is evaluated, and a relation with visual acuity is not described. Hereinafter, the Listing's Law will be briefly explained using this publication.

According to the Listing's Law, with astigmatic spectacles being worn, when an eyeball rotates from the first eye position along a spectacle principal meridian in accordance with the Listing's Law, the spectacle principal meridian and the axis of a coordinate system of the rotation in accordance with the Listing's Law becomes parallel to each other, so that the angle there between becomes zero.

However, when the eyeball changes to a direction different from the spectacle principal meridian, the angle between the spectacle principal meridian and the axis of a coordinate system of the rotation does not become zero. In such a case, an angle displacement similar to that in the above-described publication occurs.

By considering this angle displacement of the coordinate system, a precise power error and astigmatism can be calculated. Typically, even when it is an astigmatism which has the same absolute value as the absolute value of a reference astigmatism (an astigmatic amount and astigmatic axis at the lens center), the astigmatism has a directionality similar to vector values, so that a new astigmatism of a value which is not zero arises. Hereinafter, this astigmatism is referred to as a residual astigmatism. Incidentally, that the power error is invariable for coordinate changes due to the Listing's Law.

Here, relations of the power error and the residual astigmatism, which are off-axis aberrations of spectacle lenses, with the spherical diopter and the astigmatic diopter will be described. By considering the spherical diopter and the astigmatism diopter as aberration amounts, there are relations of the following equations when the residual astigmatism and the astigmatism diopter are positive. Also, when the residual astigmatism and the astigmatism diopter are negative, it is only for definition and there is no physical difference.

$$\text{Spherical diopter} = \text{power error} - \text{residual astigmatism}/2 \quad (1)$$

$$\text{Astigmatic diopter} = \text{residual astigmatism} \quad (2)$$

Next, when seeing FIG. 5, it is clear that values of the horizontal axis (spherical diopter) are not symmetrical with respect to the origin. Further, values of the vertical axis (astigmatic diopter) also have nonlinear data peculiar to a living human body. For example, when visual acuity values with the same absolute value on the horizontal axis and with different signs are examined, it is clear that a functional relation is not simple. In other words, the visual acuity value is nonlinear with respect to the optical performance value. Therefore, the nonlinear nature peculiar to the living human body needs to be taken into consideration.

Thus, in the present invention, an interpolation function V is first calculated from the data of FIG. 5. Specifically, the horizontal axis values (spherical diopter) and the vertical axis values (astigmatic diopter) are respectively scaled for 0.1 to 1 diopter, and visual acuity values are discretely plotted. Then, by interpolating the visual acuity values on the plane coordinate using a generally known interpolation method, the interpolation function V including the spherical diopter and the astigmatic diopter as parameters is calculated. The interpolation function V is expressed by the following equation:

$$\text{first interpolation function } V = V (\text{spherical diopter, astigmatic diopter}) \quad (3)$$

According to this equation (3), when the spherical diopter and astigmatic diopter as parameters are continuous values, a value of the interpolation function V can be calculated. The value of the interpolation function is the fraction visual acuity (=decimal visual acuity).

By substituting the spherical diopter and the astigmatic diopter of this equation (3) with the equations (1) and (2) respectively, the following equation (4) is obtained.

$$\text{second interpolation function } V = V (\text{power error, residual astigmatism}) \quad (4)$$

According to this equation (4), the power error and the residual astigmatism obtained by optical calculation are correlated to the value of the interpolation function. The value of the interpolation function is the fraction visual acuity (=decimal visual acuity).

The second interpolation function V of this equation (4) can be used as it is as the visual acuity function in unit of the fraction visual acuity (decimal visual acuity). However, this function has a strong nonlinearity and also has no physical meaning, so that it is hardly in the best state for optimization calculation. Accordingly, as the following equation (5), it is preferable to convert the unit of the equation (4) to the logMAR, which is generally adopted nowadays.

$$\text{first visual acuity function [logMAR]} = \log_{10}(1/V(\text{power error, residual astigmatism})) \quad (5)$$

Through the above processing, the visual acuity function in which the nonlinear nature of a living human body from the optical performance point of view is taken into consideration is derived (refer to International Patent Application of the inventor of the present invention, PCT/JP 02/04244: P11-P22, FIG. 1 to FIG. 12). The visual acuity of the living human body of course changes largely depending on age, a measurement environment, and so forth. In fact, however, the above-described basic method requires a large calculation amount in the optimization calculation. Therefore, instead of the above-described equation (5), an approximate equation such as the following equation (6) can be used:

$$\text{second visual acuity function} = \alpha X[(\text{power error})^2 + (K \times \text{residual astigmatism}/2)^2]^{1/2} \quad (6)$$

where, $\alpha$ is a coefficient within a range of $0.25 \leq \alpha \leq 0.65$, preferably 0.4751. K is a coefficient within a range of $0.2 \leq K < 1$.

Using this equation (6), the power error, residual astigmatism, and visual acuity at a position which is 20 [mm] aside from the lens center are calculated with the conditions shown in Table 10. Consequently, visual acuity when there is no influence of the chromatic aberration is calculated. The obtained data are shown in Table 13.

TABLE 13

| Power error (dptr) | 0.167 |
|---|---|
| Residual astigmatism (dptr) | 0.419 |
| Visual acuity (logMAR) | 0.127 |

FIG. 6 is a view showing plots of data based on Tables 12 and 13 (hereinafter referred to as "combination data 1") which are newly added to FIG. 2 by the inventor of the present invention, in which visual acuity deteriorations of the chromatic aberration of magnification and the other aberration are combined. In the data (chromatic aberration of magnification) of Table 12 derived from the document 1, the linear relation described during the consideration of FIG. 2 is derived. Also, a segment visual acuity when the chromatic aberration of magnification on the horizontal axis becomes zero should be 0.127 as shown in Table 13. Specifically, the numeric values are adopted from results of measurement data of 7251 persons.

Therefore, even when the visual acuity function (6) of approximate equation is used, the data is remarkably reliable as against the other data. Then, in FIG. 6, the combination of visual acuity deteriorations of the chromatic aberration of magnification and the other aberration is a straight line which passes through the horizontal axis 0 (zero) and the vertical axis 0.127 (hereinafter referred to as a "combination straight line 1").

Further, the combination straight line is obtained by a substantially parallel movement of the approximation straight line of the data of subject No. 3 (refractive index 1.7000, Abbe number 48.1) among the data of visual acuity deterioration. That is to say, in FIG. 6, the combination straight line, which is obtained under a condition that the chromatic aberration of magnification and the other aberration both affect the visual acuity, is obtained by shifting the approximation straight line of the data of subject No. 3, which is obtained under a condition that only the chromatic aberration of magnification affects the visual acuity, upward by the segment visual acuity which is the visual acuity when only the aberrations other than the chromatic aberration of magnification affected the visual acuity.

[Conclusion]

From this fact, the inventor has found first that, in order to express visual acuity in [logMAR] unit, the deterioration of visual acuity without chromatic aberration should be simply added to the deterioration of visual acuity due to chromatic aberration.

Next, in order to verify the conclusion, data of a cut-off frequency at a position which is 10 [mm] aside from the center of FIG. 11 of the document 1 are modified by a technique similar to that of calculating the data of Table 12 and then adopted. In other words, logMAR, chromatic aberration of magnification, normalization of visual acuity data, and visual acuity calculation when there is no chromatic aberration are performed. This data shows the data calculated from data of No. 1, 4 shown in FIG. 11.

First, the form data of Table 10 are used to calculate the cut-off frequencies at 10 [mm] from the center. This data is shown in Table 14.

TABLE 14

| Prism (prism diopter) | $6.68^\Delta$ |
|---|---|

Using this data, the normalized cut-off frequency of FIG. 11 of the document 1 are shown in Table 15.

TABLE 15

| | Abbe number | Chromatic aberration of magnification | The number of stripes at the position 10 mm aside (cycles/degree) | The number of stripes at the center | logMAR visual acuity at the position 10 mm aside |
|---|---|---|---|---|---|
| No. 1 | 29.8 | 0.224 | 32.449 | 49.375 | 0.182 |
| No. 4 | 55.5 | 0.120 | 43.061 | 53.125 | 0.091 |

The power error, the astigmatism, the visual acuity without chromatic aberration at 10 [mm] from the center are shown in Table 16.

TABLE 16

| Power error (dptr) | 0.023 |
|---|---|
| Residual astigmatism (dptr) | 0.196 |
| Visual Acuity | 0.048 |

Here, values obtained by subtracting the visual acuity without chromatic aberration of Table 13 from the values of the logMAR visual acuity at 20 [mm] of Table 12 can be treated as the chromatic aberration of magnification itself. In other words, the values become the same format as FIG. 2. Similarly, values obtained by subtracting the visual acuity value of Table 16 from the logMAR visual acuity at 10 [mm] from the center of Table 15 become the same format as FIG. 2. These values are shown in Table 17.

TABLE 17

| | Chromatic aberration of magnification | Visual acuity from which an influence other than chromatic aberration of magnification is subtracted |
|---|---|---|
| No. 4 (10 mm) | 0.120 | 0.043 |
| No. 1 (10 mm) | 0.224 | 0.134 |

TABLE 17-continued

| | Chromatic aberration of magnification | Visual acuity from which an influence other than chromatic aberration of magnification is subtracted |
|---|---|---|
| No. 4 (20 mm) | 0.283 | 0.039 |
| No. 3 (20 mm) | 0.327 | 0.101 |
| No. 2 (20 mm) | 0.382 | 0.112 |
| No. 1 (20 mm) | 0.527 | 0.202 |

The data of this Table 17 (hereinafter referred to as "combination data 2") displayed simultaneously with the data of FIG. 2 becomes FIG. 7. In FIG. 7, approximation straight lines of plots of the combination data 2 (hereinafter referred to as a "combination straight line 2") are also shown. From FIG. 7, the deterioration of logMAR visual acuity is proportional to the chromatic aberration of magnification, and it is proved to be proportional even in a range of the chromatic aberration of magnification of 0.2 or lower. From the above data, it can be verified that the sum of the visual acuity deterioration only due to aberrations other than the chromatic aberration and the deterioration of the visual acuity only due to the chromatic aberration is the total deterioration of the visual acuity.

To express this finding by numerical expression, a term of the chromatic aberration of magnification is added to the equation (6), providing the following equation (7):

$$\text{third visual acuity function} = \alpha \times [(\text{power error})^2 + (K \times \text{residual astigmatism})^2]^{1/2} + \beta \times \text{chromatic aberration of magnification} \quad (7)$$

where, $\alpha$ is a coefficient within a range of $0.25 \leq \alpha \leq 0.65$, preferably 0.4751. $\beta$ is a coefficient varying depending on each person within a range of $0.2 \leq \beta \leq 1.2$, preferably $0.2 \leq \beta \leq 1.0$, more preferably 0.6. Note that values of $\alpha$ and $\beta$ respectively vary from measured data numbers. K is a coefficient within a range of $0.2 \leq K < 1$, preferably $0.2 \leq K < 0.6$.

Here, as an optical value related to the chromatic aberration of magnification, a residual prism is defined. The residual prism is an amount which has a prism direction measured from a coordinate system in accordance with the Listing's Law. The absolute value thereof is used in the equation (7). The chromatic aberration of magnification in the equation (7) is a value obtained by dividing the absolute value of the residual prism by an Abbe number.

Since the Listing's Law is taken into consideration in the visual acuity function of the equation (7), it can faithfully express visual acuity when used for design or evaluation of astigmatic lenses or the like.

Note that the equation (7) can be applied to spherical lenses. However, on the principal meridian of a spherical lens, the value of the residual astigmatism becomes equivalent to the astigmatism, so that the Listing's Law should not necessarily be considered in design or evaluation of the spherical lens. Accordingly, a visual acuity function of the following equation (8) may be applied to the spherical lenses:

$$\text{fourth visual acuity function} = \alpha \times [(\text{power error})^2 + (K \times \text{residual astigmatism})^2]^{1/2} + \beta \times \text{chromatic aberration of magnification} \quad (8)$$

where, $\alpha$ is a coefficient within a range of $0.25 \leq \alpha \leq 0.65$, preferably 0.4751. $\beta$ is a coefficient varying depending on each person within a range of $0.2 \leq \beta \leq 1.2$, preferably $0.2 \leq \beta \leq 1.0$, more preferably 0.6. Note that values of $\alpha$ and $\beta$ respectively vary from measured data numbers. K is a coefficient within a range of $0.2 \leq K < 1$, preferably $0.2 \leq K < 0.6$.

[Application of the Visual Acuity Functions to Designing of Lenses]

As described above, in the process of correcting aberrations in an optical system, a common designing method is to minimally calculate a merit function, which is composed by evaluation functions of several aberrations and lens forms, by a known optimization calculation (for example, Japanese Examined Patent Publication No. Hei 02-38930).

First, various types of evaluation indexes can be incorporated as the factors configuring the merit function. For example, aberrations which should be corrected for spectacles include distortion aberration, though it is not directly related to the visual acuity value. The distortion aberration is widely known as a cause of sway and distortion mainly during initial period of fitting spectacles.

Conventionally, the distortion of spectacles are expressed as a visual angle magnification M (refer to "Kazuo Miyake: *Futatabi kakubairitsu nitsuite* (On Angle Magnification Again), *KOHGAKU* (OPTICS) Vol. 19, No. 10") (hereinafter referred to as document 10). When expressing the visual angle magnification as $M_0$ by an equation, it becomes:

$$M_0 = \lim_{\text{exit angle} \to 0} (\tan(\text{exit angle})/\tan(\text{incident angle})) \quad (9)$$

Here, $M_0$ can be easily calculated by paraxial optical calculation. $M_0$ will be simply explained. When an exit ray passes the center of an eyeball entrance pupil, $M_0$ is usually called a spectacle magnification. However, when the exit ray passes a center of cycloduction, it is more appropriate to be called a rotation visual angle magnification, imitating Miyake of the document 10.

Further, letting a visual angle magnification of a peripheral portion be M, $$M = \tan(\text{exit angle})/\tan(\text{incident angle}) \quad (10)$$

Then, the distortion aberration (DIST) of spectacles is expressed as the following equation (11) using the equations (9), (10):

$$\text{DIST} = 100 \times ((M/M_0) - 1) \quad (11)$$

The equation (11) is a relational expression which has been conventionally derived. Normally, the exit ray passes the center of cycloduction, and the DIST is called a dynamic distortion aberration of spectacles.

Here, the equation (11) is studied from a designing method in which an eyeball motion is taken into consideration. Similarly to the explanation of the residual astigmatism and the residual prism, even when it is the same DIST, a residual DIST occurs due to a difference of axial direction since the DIST is a vector value.

In other words, the conventional $M_0$ and M are calculated, as DIST when they have the same direction as a condition in a background. For example, when $M_0$ and M in the same direction are the same amount, it is calculated as DIST=0 by the equation (11). Since the calculation include the above-mentioned angle displacement generated by the eyeball motion, $M_0$ and M are extendedly defined naturally as vector amounts.

Then, when the lens is an astigmatic lens, $M_0$ becomes a vector value having a different value in the radiation direction at a lens diopter reference point (usually, the center part of a lens). At a lens evaluation point of optimization calculation, a residual visual angle magnification is defined as a value obtained by subtracting the central visual angle magnification from the visual angle magnification.

In other words, when the residual visual angle magnification=$M - M_0$, and the Sign is defined as a positive/negative sign of a scalar product of the residual visual angle magnification and $M_0$, the extended definition of the distortion aberration of spectacles of the present invention in which the Listing's Law is taken into consideration becomes the following equations (12), (13). Further, the relation thereof is shown in FIG. 8.

Residual visual angle magnification=visual angle magnification $M$–visual angle magnification $M_0$ (12)

Extended DIST=Sign×100×(|residual visual angle magnification|/|visual angle magnification $M_0$|) (13)

In the spectacle lens designing of the present invention, calculation is performed by the ray tracing method while letting a ray pass a lens, where the equations (7), (13) are calculated at respective evaluation points of the lens.

Note that the evaluation points are plural virtual points which are set on a spectacle lens in order to evaluate an optical performance of the spectacle lens. The evaluation points can be set to approximately 5 to 10 points for an axially symmetric lens and approximately 15 to 10000 points for an axially asymmetric lens.

In the case of the equation (7), different values are obtained depending on the evaluated object distance. Which object distance to be taken is dependent on a lens characteristic and discretion of designer. For example, strictly speaking, there is no actually measured visual acuity value of near vision in the following equation (14), but responses to the power error and the residual astigmatism are calculated assuming that they are similar to those of the visual acuity of far vision of the equation (7).

The dynamic distortion aberration of spectacles is not theoretically related to the distance, but the one for which no clear judgment material on how to distribute visual acuity and distortion is available is also dependent on the discretion of a designer. From the above, a merit function of single evaluation rate scale, which is a combined function of general evaluation functions of the present invention, becomes the following equation (14).

[Equation 3] (14)

$$\text{merit function} = a \times \sum_{n=1}^{m} (u_n \cdot \text{far vision}_n)^2 +$$
$$b \sum_{n=1}^{m} (v_n \cdot \text{near vision}_n)^2 +$$
$$c \times \sum_{n=1}^{m} (w_n \cdot DIST_n)^2$$

where, m is a natural number expressing the number of set evaluation points, n is a natural number assigned to the respective evaluation points, the far vision is a value when looking a far region of a visual acuity function at the evaluation point, and the near vision is a value when looking a near region of a visual acuity function at the evaluation point. The visual acuity function used in this equation (14) is the equation (7) which includes the chromatic aberration.

Further, a, b, c are predetermined coefficients respectively expressing weight distribution of the respective terms in the equation (14), and u, v, w are coefficients respectively expressing weight distribution of the respective evaluation points. Note that the weight includes the concept zero. However, zero is not adopted here as the weight.

Here, the far region can be defined as, for example, a range from a reference point to a far point of 10 [m] to infinity. An expression of this range in diopter unit is 0 [D] to 0.1 [D]. Further, the near region can be defined as, for example, a range between the reference point and 30 [cm] to 33 [cm]. An expression of this range in diopter unit is approximately 3 [D] to 3.33 [D]. Further, there is no uniform standard to determine where should the reference point be, but it is normally at the center of cycloduction, a lens surface, or the center of cornea.

Since the Listing's Law is taken into consideration in the equation (14), evaluation or design which is more faithful to visual acuity can be performed when the equation (14) is applied to an astigmatic lens or the like.

Note that the equation (14) can be applied to spherical lenses. However, on the principal meridian of a spherical lens, the value of the residual astigmatism becomes equivalent to the astigmatism, and the residual DIST becomes equivalent to the DIST (distortion aberration), the Listing's Law should not necessarily be considered in design or evaluation of the spherical lens. Accordingly, a merit function of the following equation (15) can be applied to the spherical lenses:

[Equation 4] (15)

$$\text{merit function} = a \times \sum_{n=1}^{m} (u_n \cdot \text{far vision}_n)^2 +$$
$$b \sum_{n=1}^{m} (v_n \cdot \text{near vision}_n)^2 +$$
$$c \times \sum_{n=1}^{m} (w_n \cdot DIST_n)^2$$

where, m is a natural number expressing the number of set evaluation points; n is a natural number assigned to the respective evaluation points; the far vision is a value when looking a far region of a visual acuity function at the evaluation point; the near vision is a value when looking a near region of a visual acuity function at the evaluation point; DIST is a value of the distortion aberration at the evaluation point; a, b, c, are predetermined coefficients respectively expressing weight distribution of the respective terms in the equation (15); and u, v, w, are coefficients respectively expressing weight distribution of the respective evaluation points.

A characteristic, aesthetic, economic, and optical consideration and the like of the lens are carried out to design a good lens, and the weight distribution is performed and determined by the discretion of a designer. Further, there is also a case in which a term such as a lens form which is not directly relevant to visual acuity is added to the merit function. Such a case is also within the scope of the present invention when the above-described equation is the main factor therein.

When the chromatic aberration is positively shown (directly expressed) on the merit function, it becomes the following equation:

[Equation 5] (16)

$$\text{merit function} = a \times \sum_{n} (u_n \cdot \text{far vision}_n)^2 +$$
$$b \sum_{n} (v_n \cdot \text{near vision}_n)^2 +$$
$$c \times \sum_{n} (w_n \cdot \text{residual } DIST_n)^2 +$$

-continued $$d \times \sum_{n} (s_n \cdot \text{chromatic aberration of magnification}_n)^2$$

The visual acuity function in the equation (16) is the function (6) which does not include the chromatic aberration. a, b, c, d are weight distribution at respective evaluation functions. u, v, w, s are weight distribution at respective evaluation points. n is the evaluation point of the spectacle lens. The ratio of a, b in the equation (16) is that of the $\alpha$, $\beta$ in the equation (7).

The merit functions in this equation (16) is also substantially equivalent to the equation (14). Further, the merit function in which DIST is adopted instead of the residual DIST in the equation (16) is substantially equivalent to the equation (15).

The merit function will be studied from the viewpoint of the degree of designing freedom. When a spectacle lens design in which a front surface and a rear surface of the lens are free curved surfaces which can be restrictively transformed freely under a condition that the diopter of the lens is fixed is used, a first term of a second term of the merit function can be satisfied by a combination of transformation of the two surfaces. Specifically, at a certain object distance, a power error and a residual astigmatism which are constituent factors of the visual acuity function can be both made zero.

However, under a restrictive condition that the front surface which is one of surfaces of a lens is axially symmetric lens in aesthetic and economic aspects, it is not possible to make both the power error and the residual astigmatism at a certain object distance zero on the entire surface (both surfaces) of the spectacle lens. Still more, generally it is difficult to make the chromatic aberration of magnification and the residual DIST zero in the surface structure having a diopter, without influencing other evaluation functions.

Therefore, coefficients and weights are dependent on the discretion of a lens designer. Further, from the viewpoint of the degree of designing freedom, when the front surface is fixed to be spherical or the like, the freedom of the designer is limited, and it becomes difficult to control the residual DIST which is the third term in the merit function. To explain this further, when it is possible for the designer to freely transform the front surface and the rear surface of the spectacle lens, the merit function which is the function of the surface thereof can be freely controlled, whereas, when there is a designing restriction such as the spherical surface, it influences the minimization of the merit function.

EXPLANATION OF NUMERALS AND SYMBOLS

1 . . . international type visual acuity chart, 2 . . . prism, 3 . . . spectacle lens, 4 . . . spectacle lens, 41 . . . center of spectacle lens, 42 . . . side of spectacle lens, 5 . . . mask, 51 . . . circular opening, 6 . . . moire pattern presentation device, 10 . . . spectacle lens, 11 . . . optical axis, 12 . . . spherical cone, 13 . . . center of cycloduction (center of rotation of an eyeball), 14 . . . rear vertex, 15 . . . rear plane surface, $\theta$ . . . clear vision angle, R . . . clear vision diameter, VR . . . distance from the rear vertex to the center of cycloduction.

BEST MODE FOR CARRYING OUT THE INVENTION

Hereinafter, embodiments of an evaluation method of the present invention will be explained. In the present invention, a lens designing method using a general, publicly known ray tracing method using a computer is used, and an explanation of detailed designing method is omitted since it is the same as that described in the prior art. However, optical performance calculation and a displaying program of its results are composed including an after-mentioned processing program related to calculation and display of a clear visual angle and a clear visual diameter.

EXAMPLE 1

Comparison of Clear Visual Diameter of Spectacle Lenses when Abbe Numbers are Different To begin with, the clear visual diameter will be explained. First, a visual acuity function of the equation (7) is used to define a clear visual area of a spectacle lens. The clear visual area is an area of the spectacle lens which can be clearly seen. Incidentally, the clear visual area is also referred to as, for example, a distinct visual area or a standard visual area.

Specifically, the clear visual area is defined based on a logMAR visual acuity value which is a value of the visual acuity function of the equation (7). In particular, when it can be most clearly seen when the value of the logMAR visual acuity is zero, a region preferably within a range of zero to 0.1 or 0.2 is defined as the clear visual area. To express this region in decimal visual acuity, it becomes 1 to approximately 0.6 or approximately 0.8. This range is a preferable reference value which can be evaluated as a visual acuity value by a common sense. However, the logMAR visual acuity value which defines the clear visual area is not specifically limited, and it can be set within a range which does not depart from the object.

Hereinafter, in this example, a region in which the logMAR visual acuity is within 0.1 is defined as the clear visual area.

Next, a spherical cone which has a solid angle equal to a solid angle in which the clear visual area is expected from the center of rotation of an eye (center of cycloduction) and is axially symmetrical to an optical axis of the spectacle lens is assumed, and the clear visual angle is obtained based on the spherical cone.

(incidentally, refer to Japanese Patent Application Laid-open No. 2002-211641 for more detail)

Figure 1:
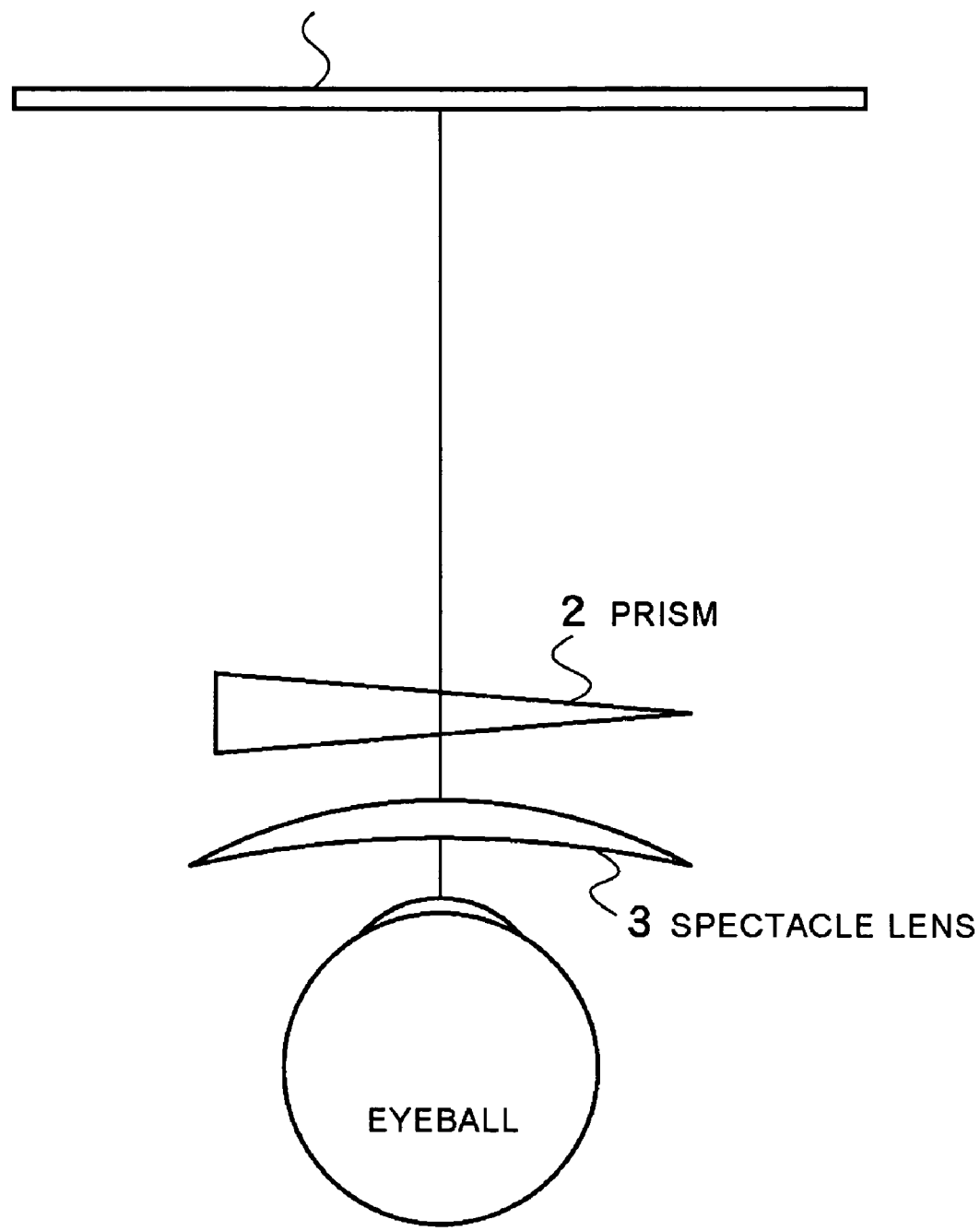
FIG. 1 is a schematic view of a measurement experiment which is performed for obtaining visual acuity deterioration due to chromatic aberration of magnification.
Figure 2:
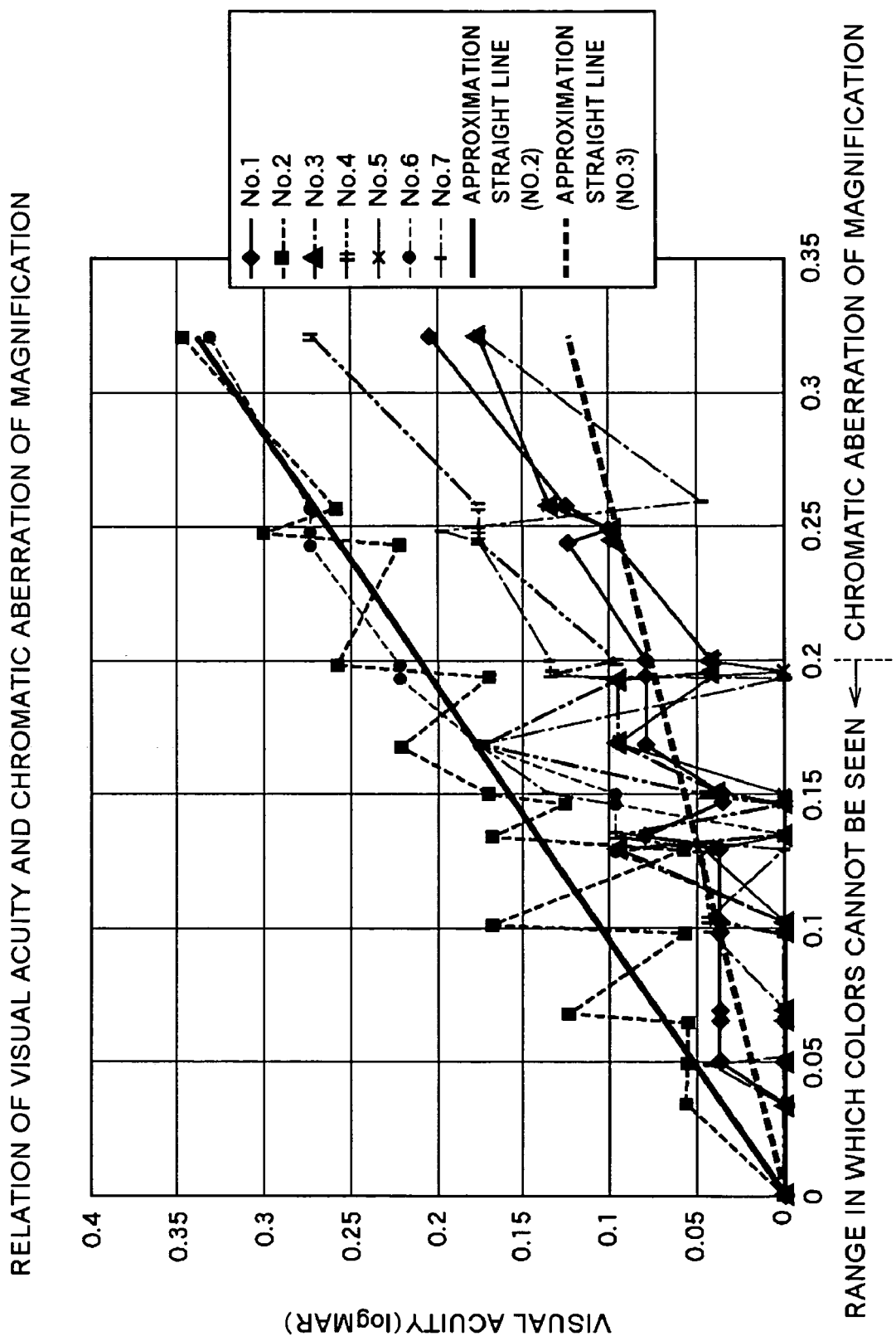
FIG. 2 is a view showing the visual acuity deterioration due to the chromatic aberration of magnification.
Figure 3:
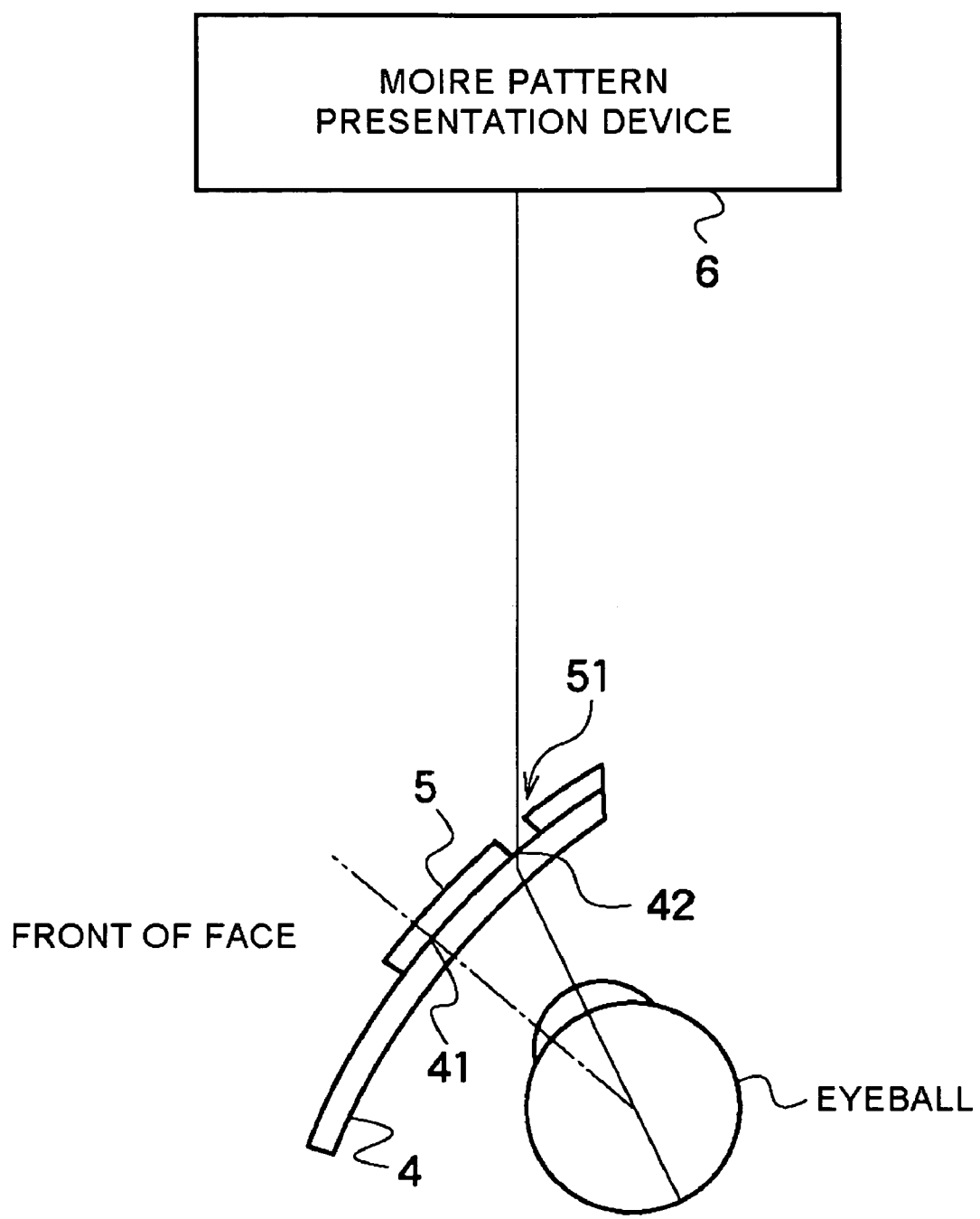
FIG. 3 is a schematic view of a measurement experiment which is performed for obtaining a combination principle of the visual acuity deterioration due to the chromatic aberration of magnification and visual acuity deterioration due to aberrations other than the chromatic aberration.
Figure 4:
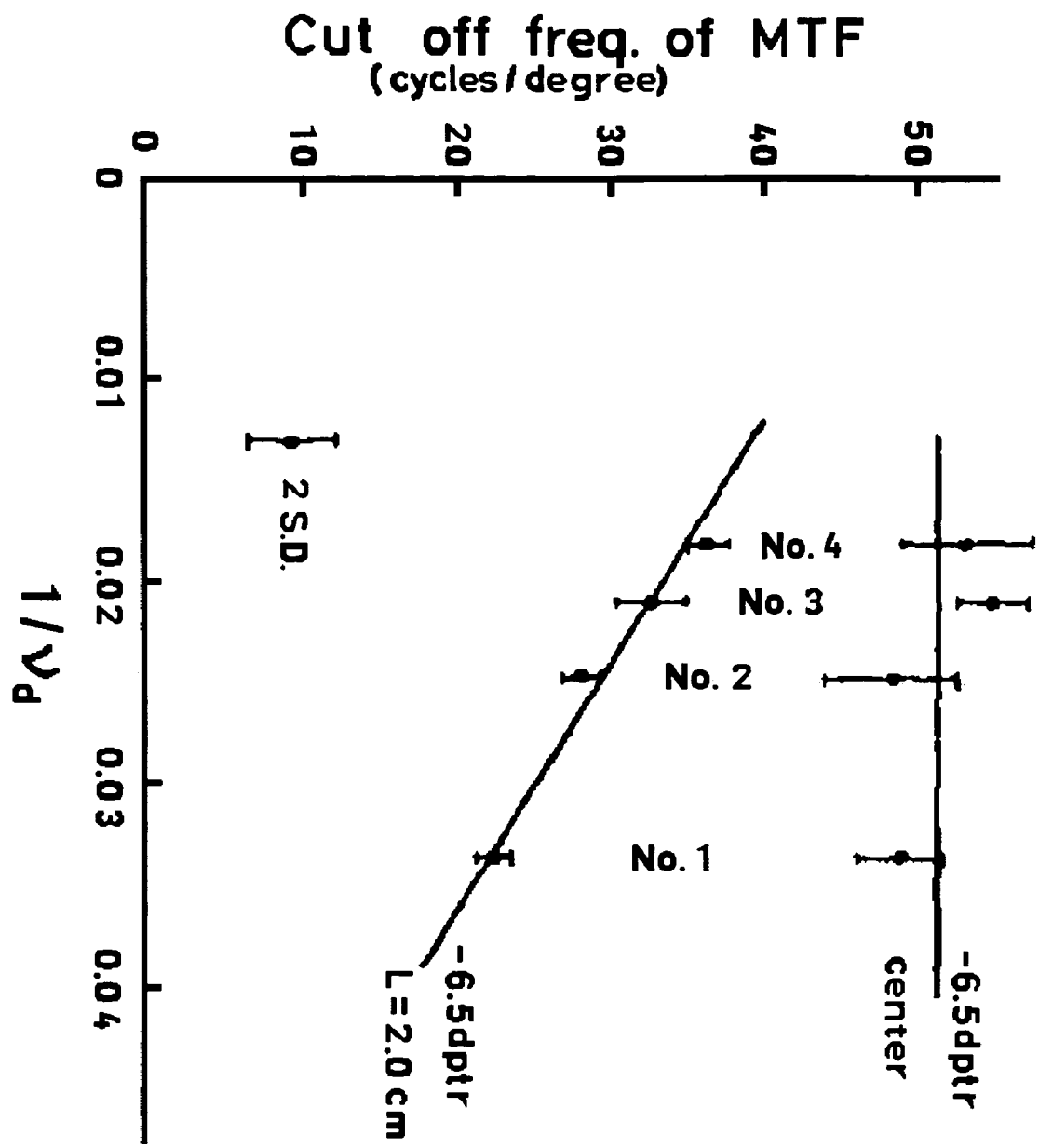
FIG. 4 is a view showing FIG. 10 of the above-described document 1 by reference.
Figure 5:
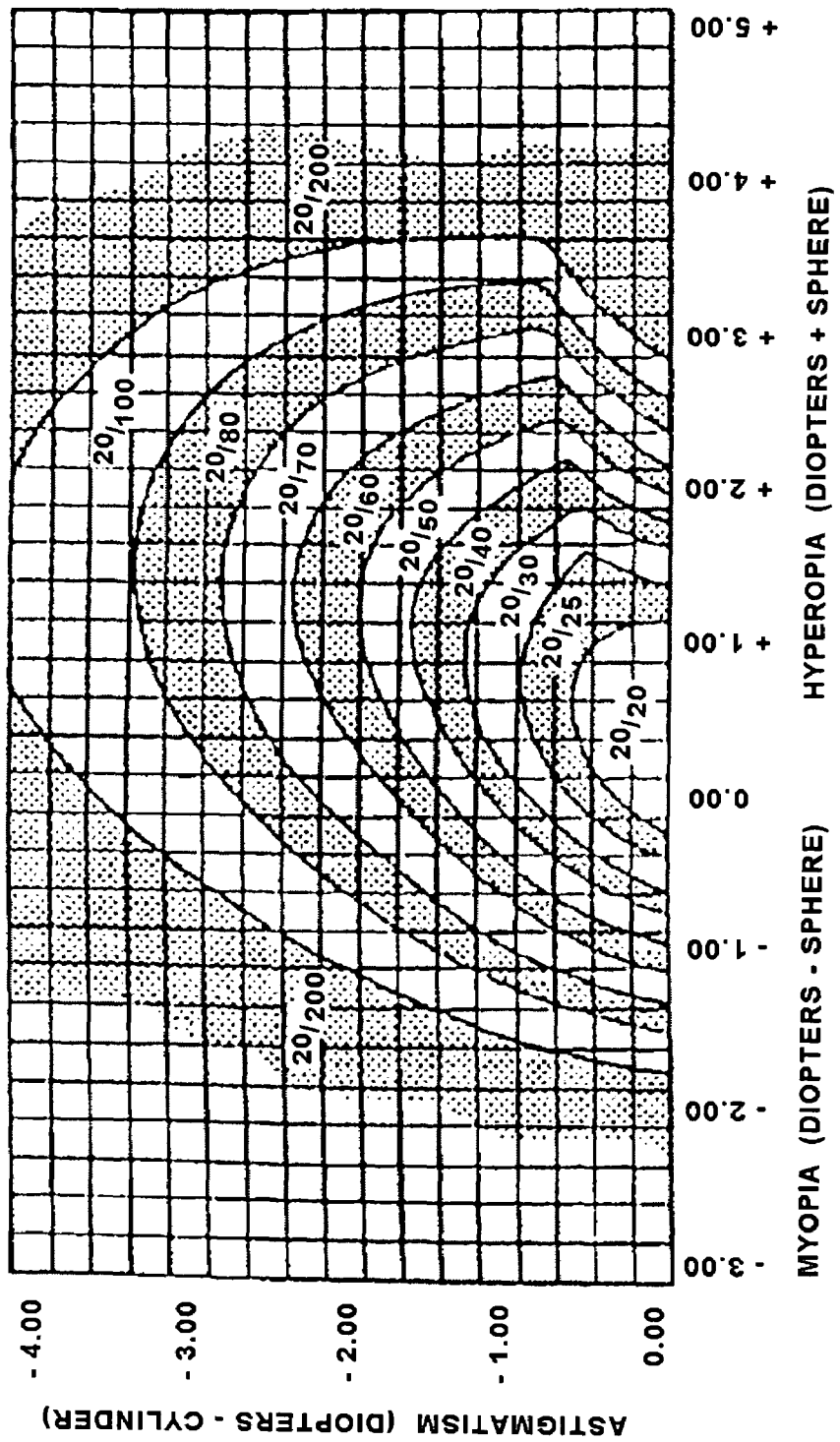
FIG. 5 is a view showing visual acuity measurement data of the above-described document 9 by reference.
Figure 6:
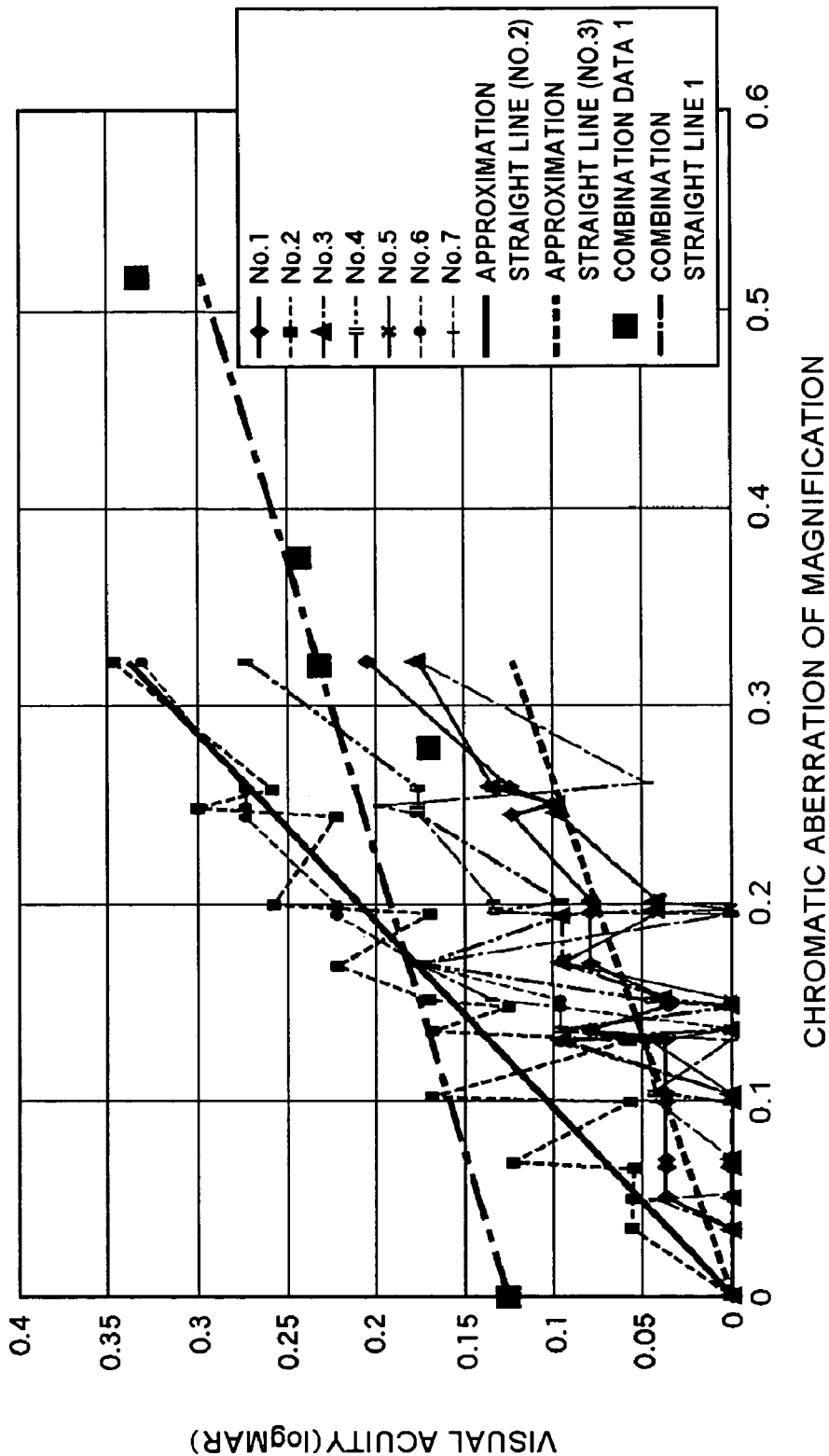
FIG. 6 is a view showing deterioration of combined visual acuity.
Figure 7:
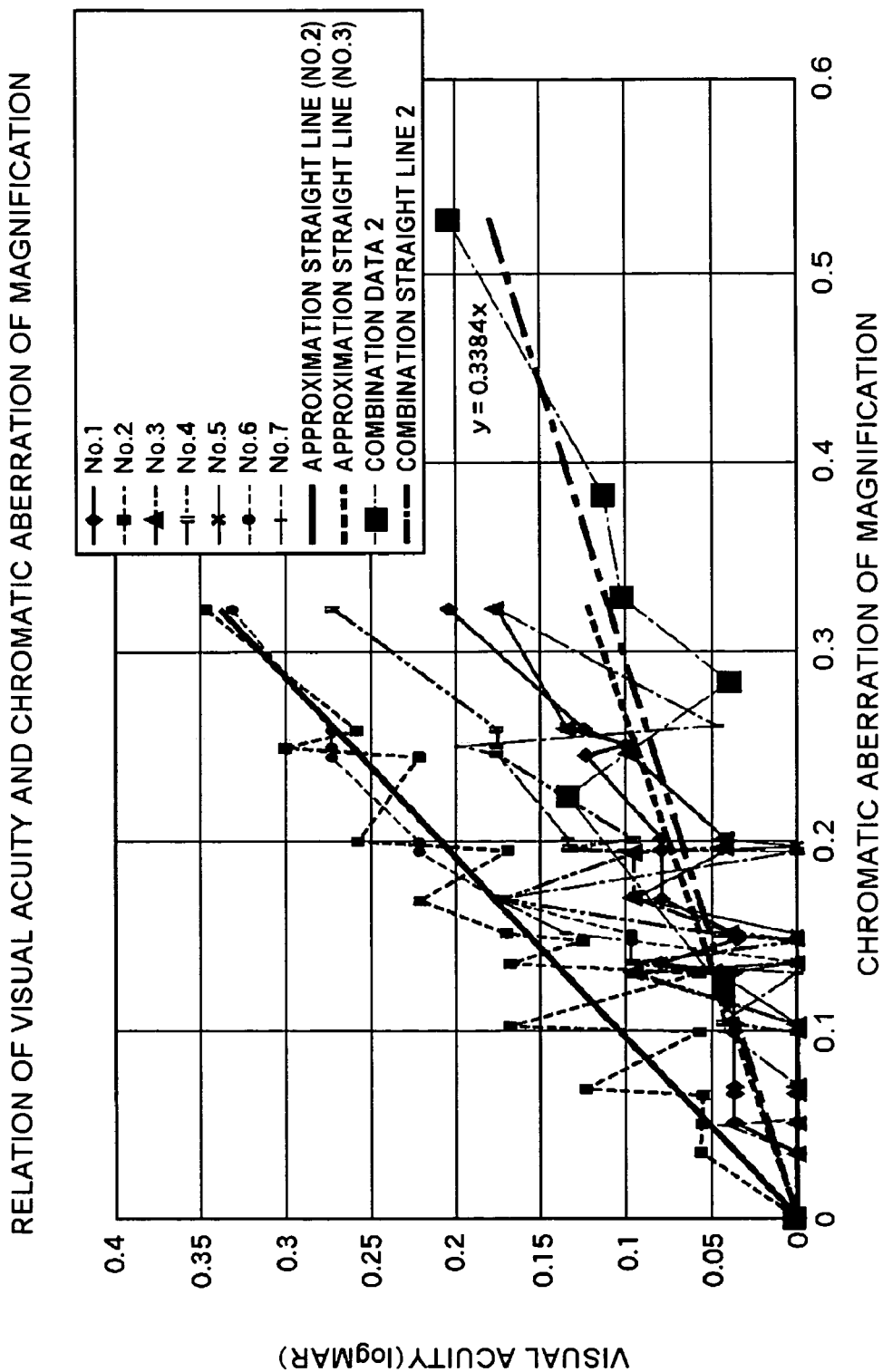
FIG. 7 is a view explaining recognition of the deterioration of the combined visual acuity.
Figure 8:
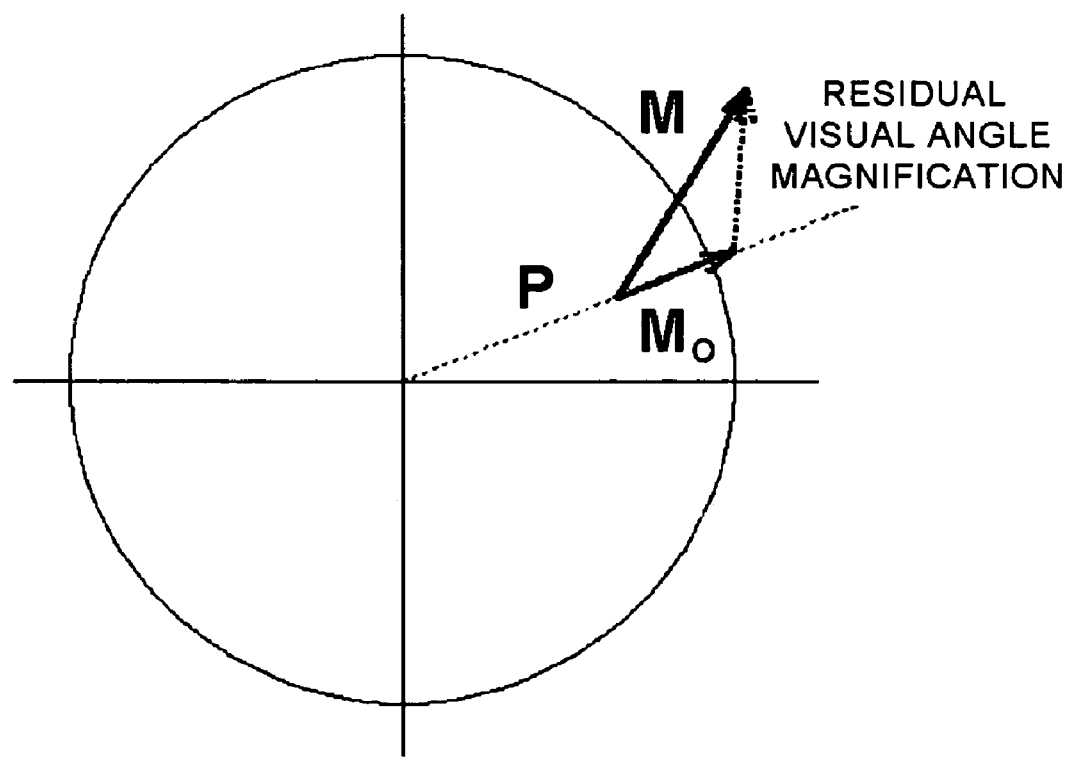
FIG. 8 is an explanatory view of a residual DIST.
Figure 9:
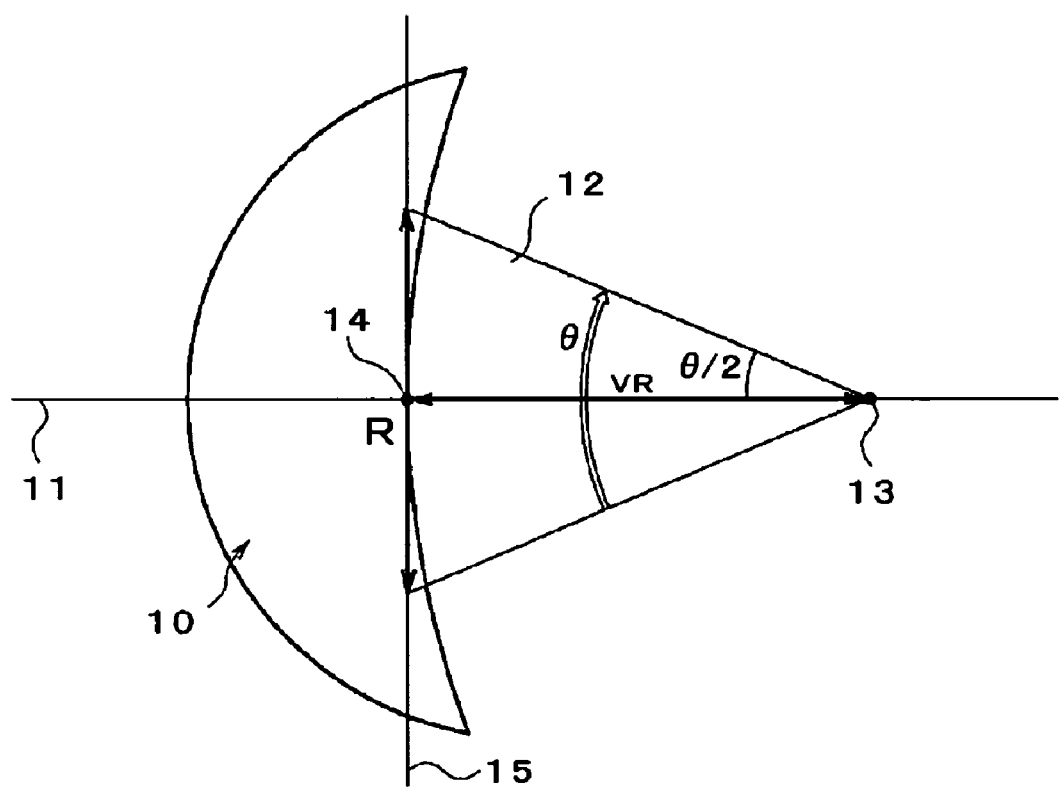
FIG. 9 is an explanatory view of a clear visual angle and a clear visual diameter.

Specifically, as shown in FIG. 9, a solid angle [steradian] is calculated as a spherical cone 12 which is axially symmetrical to an optical axis 11 of a spectacle lens 10. The spherical cone 12 has a center of cycloduction 13 as the vertex, and a spherical surface part on the spectacle lens 10 side.

When a vertex angle θ of this spherical cone 12 is calculated and expressed as the clear visual angle in unit of angle, it becomes an easily understandable expression format. The vertex angle θ of the spherical cone 12 means a vertex angle θ produced when the spherical cone 12 is cut out by a plane surface which includes the optical axis 11. Incidentally, the term "clear visual angle" is named by the inventor and can also be rephrased as, for example, average visual angle or equivalent visual angle.

Specifically, the clear visual angle can be approximately obtained by the following equation (17). The reason to use the term "approximately" is because the proportional relation between the number of rays and the solid angle is broken when the visual angle is large. However, since the solid angle to the spectacle lens having a lens diameter (specifically, for example, a diameter of 80 [mm] or less) used in a general spectacles industry is small, and the above-mentioned proportional relation does not practically affect a lens, so that the following equation (17) can be used without any problem.

[Equation 6] (17)

$$\text{clear visual angle} \cong 2 \times L \times \sqrt{\frac{N}{\pi}}$$

where, L is an angle interval when many rays incident from the center of cycloduction 13 to the spectacle lens 10 with the same angle intervals (for example, 1° pitch), and N is the number of rays which pass the clear visual area among incident rays.

The value of the clear visual angle obtained as above is a value which does not depend on the lens diameter, but depends on the absolute size of the clear visual area of the spectacle lens 10. This value of the clear visual angle can be preferably used as the optical performance value of the spectacle lens 10.

Next, in FIG. 9, it is calculated a value of a clear visual diameter R corresponding to the diameter R of a circle obtained by projecting the solid angle of the spherical cone 12 on a plane surface 15 which is perpendicular to the optical axis 11 and includes a rear vertex 14 of the spectacle lens 10. The clear visual diameter R can be approximately calculated using the following equation (18) based on the clear visual angle (the equivalent visual angle) θ and a value of a distance VR from the rear vertex 14 to the center of cycloduction 13. Incidentally, the term "clear visual diameter" is named by the inventor.

clear visual diameter=2×VR×tan (clear visual angle/2) (18)

Here, the clear visual angle is obtained by the above-described equation (17).

The values of the clear visual angle and the clear visual diameter described above are values which express the absolute size of the clear visual area of a spectacle lens. These values can be respectively displayed in unit of angle and in unit of length, which can be easily understood by a person who does not have specialized knowledge about lenses.

As above, the calculation method of the clear visual diameter has been explained. This method is applied to spectacle lenses shown in Table 18. These spectacle lenses are spherical lenses, and all have the same refractive index (1.60). When calculating the clear visual diameter, calculation in which an eyeball motion (the Listing's Law) is taken into consideration is performed for comparison of astigmatic lenses. The used equation (7) is calculated with 2.986 as α and 0.62 as β. Further, the distance VR from the rear vertex of a lens to the center of cycloduction is calculated by the following equation:

VR(mm)=27.0−(average diopter/6) (19)

Then, values of the clear visual diameter respectively corresponding to each of the diopters in Table 18 are calculated separately for the cases of no chromatic aberration, Abbe numbers 40 and 60. Results of calculation are shown in Table 19. Note that the diopter display in Tables 18, 19 are all C minus display.

TABLE 18

| Diopter S | Diopter C | Lens diameter | Thickness | Front surface curvature (1/mm) | Rear surface curvature S axis (1/mm) | Rear surface curvature C axis (1/mm) |
| --- | --- | --- | --- | --- | --- | --- |
| 8 | −2 | 65 | 8.46 | 0.018264 | 0.006054 | 0.009388 |
| 7 | −2 | 65 | 7.61 | 0.018264 | 0.007602 | 0.010935 |
| 6 | −2 | 65 | 6.47 | 0.014642 | 0.005182 | 0.008515 |
| 5 | −2 | 65 | 5.61 | 0.014642 | 0.006774 | 0.010107 |
| 4 | −2 | 70 | 5.19 | 0.01097 | 0.004543 | 0.007876 |
| 3 | −2 | 70 | 4.17 | 0.01097 | 0.006162 | 0.009495 |
| 2 | −2 | 70 | 3.09 | 0.009119 | 0.005883 | 0.009217 |
| 1 | −2 | 75 | 2.7 | 0.009099 | 0.007517 | 0.01085 |
| 0 | −2 | 75 | 2 | 0.009099 | 0.009161 | 0.012495 |
| −1 | −2 | 75 | 1.5 | 0.007281 | 0.008978 | 0.012311 |
| −2 | −2 | 75 | 1 | 0.007281 | 0.010634 | 0.013968 |
| −3 | −2 | 75 | 1 | 0.00532 | 0.010331 | 0.013664 |
| −4 | −2 | 75 | 1 | 0.00532 | 0.011998 | 0.015331 |

TABLE 18-continued

| Diopter S | Diopter C | Lens diameter | Thickness | Front surface curvature (1/mm) | Rear surface curvature S axis (1/mm) | Rear surface curvature C axis (1/mm) |
|---|---|---|---|---|---|---|
| −5 | −2 | 70 | 1 | 0.003612 | 0.01195 | 0.015283 |
| −6 | −2 | 70 | 1 | 0.003612 | 0.013616 | 0.01695 |
| −7 | −2 | 70 | 1 | 0.002144 | 0.013812 | 0.017145 |
| −8 | −2 | 70 | 1 | 0.002144 | 0.015479 | 0.018812 |

TABLE 19

| Diopter S | Diopter C | Lens diameter | Clear visual diameter (no chromatic aberration) | Clear visual diameter (Abbe number 60) | Clear visual diameter (Abbe number 30) |
|---|---|---|---|---|---|
| 8 | −2 | 65 | 30 | 15 | 10 |
| 7 | −2 | 65 | 29 | 17 | 11 |
| 6 | −2 | 65 | 33 | 18 | 12 |
| 5 | −2 | 65 | 36 | 23 | 16 |
| 4 | −2 | 70 | 35 | 23 | 17 |
| 3 | −2 | 70 | 42 | 31 | 24 |
| 2 | −2 | 70 | 44 | 36 | 31 |
| 1 | −2 | 75 | 53 | 44 | 37 |
| 0 | −2 | 75 | 66 | 51 | 42 |
| −1 | −2 | 75 | 64 | 39 | 29 |
| −2 | −2 | 75 | 59 | 35 | 23 |
| −3 | −2 | 75 | 51 | 23 | 17 |
| −4 | −2 | 75 | 51 | 23 | 15 |
| −5 | −2 | 70 | 32 | 18 | 12 |
| −6 | −2 | 70 | 40 | 18 | 12 |
| −7 | −2 | 70 | 28 | 15 | 10 |
| −8 | −2 | 70 | 35 | 15 | 9 |

Figure 10:
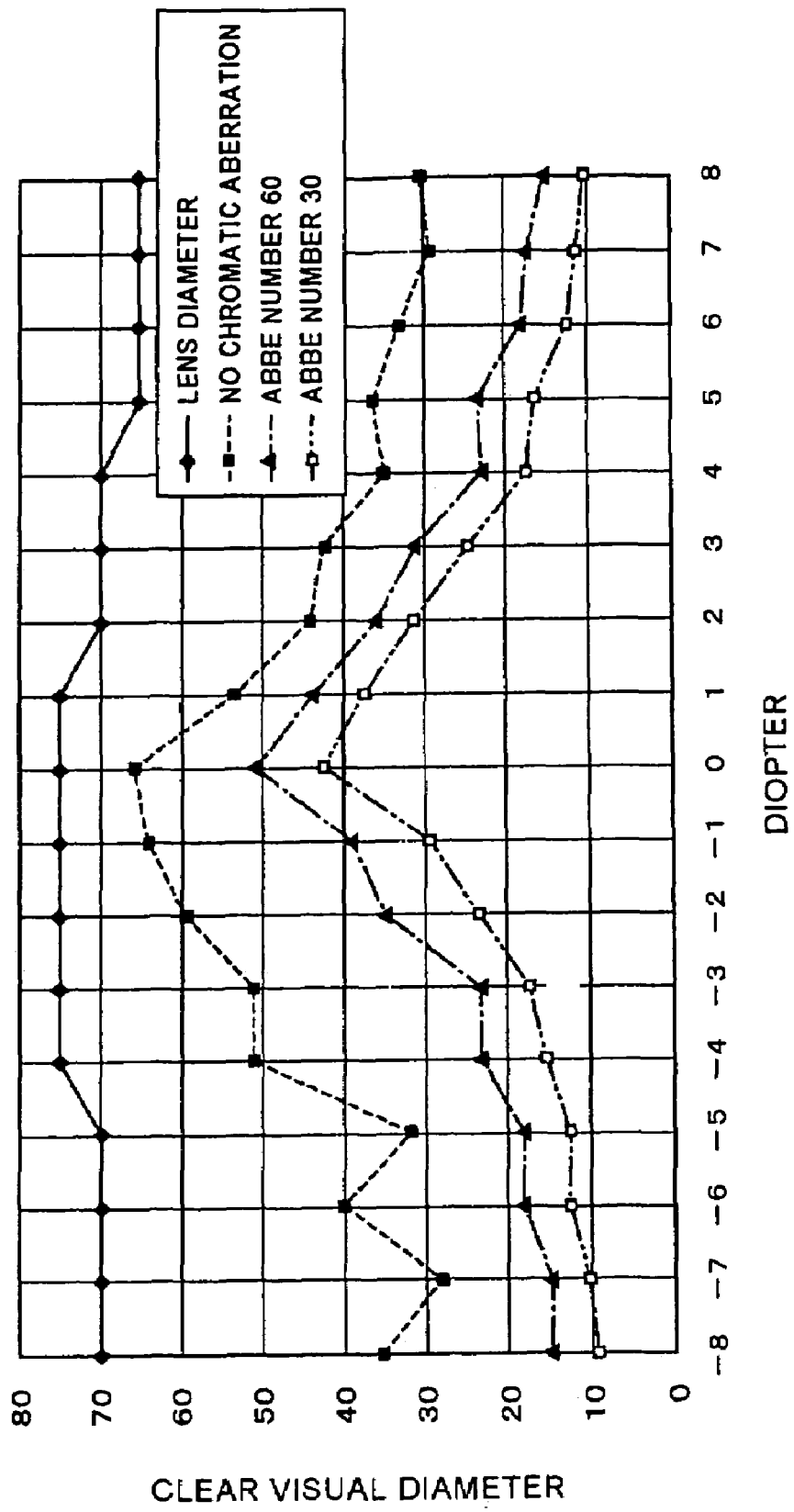
FIG. 10 is a view showing a relation between the clear visual diameter of a spectacle lens and a diopter by each Abbe number.

Furthermore, the data of Table 19 are plotted and shown in FIG. 10. In FIG. 10, spherical diopters are taken on the horizontal axis, and lens diameters (clear visual diameter) are taken on the vertical axis in [mm] unit. The lenses of respective diopters are all in the same form having the lens data of Table 12, and they are just comparisons of the clear visual diameters in the cases of no chromatic aberration, Abbe numbers 60 and 30. In FIG. 10, respective sequential line graphs connecting plots show lens diameters, the clear visual diameters in the case of no chromatic aberration, the clear visual diameters in the case of Abbe number 60, and the clear visual diameters in the case of Abbe number 30, sequentially from the one having the largest lens diameter.

Here, the distance from the sequential line showing the lens diameters to the sequential line showing the clear visual diameter in the case of no chromatic aberration indicates deterioration of visual acuity due to the power error and the residual astigmatism. Further, the distance from the sequential line showing the clear visual diameter in the case of no chromatic aberration to the sequential line showing the clear visual diameter in the case of Abbe number 60, or to the sequential line showing the clear visual diameter in the case of Abbe number 30 indicates the deterioration of visual acuity due to the chromatic aberration of magnification.

Accordingly, based on FIG. 10, it is clear that the deterioration of visual acuity due to the chromatic aberration (chromatic aberration of magnification) is larger as compared to the power error and the residual astigmatism. This fact suggests that the chromatic aberration should not be ignored for improvement of lens performance.

As above, the relation between the Abbe number and the clear visual diameter has been explained. This example can be applied mainly to optical performance calculation by Abbe number variations during development of lens materials.

EXAMPLE 2

A Necessary Abbe Number for Visual Angle 30° to be Within the Clear Visual Diameter This example answers a question, how much degree of the Abbe number is necessary during development of lens materials. Various data of lenses applied in this example is shown in Table 20. Other calculation conditions are the same as those in Example 1.

The technique of calculation is performed in such a manner that the Abbe number is gradually increased from a small value, and the calculation is stopped when it becomes the clear visual area at the visual angle of 30° (cycloduction angle of 15°). Here, the clear visual area is defined as a region in which the logMAR visual acuity becomes 0.1 or lower. Results of the calculation are shown in Table 21 and FIG. 11.

TABLE 20

| Diopter S | Diopter C | Lens diameter | Thickness | Front surface curvature (1/mm) | Rear surface curvature S axis (1/mm) | Rear surface curvature C axis (1/mm) |
|---|---|---|---|---|---|---|
| 8 | 0 | 65 | 8.46 | 0.018264 | 0.006054 | 0.006054 |
| 7 | 0 | 65 | 7.61 | 0.018264 | 0.007602 | 0.007602 |
| 6 | 0 | 65 | 6.47 | 0.014642 | 0.005182 | 0.005182 |
| 5 | 0 | 65 | 5.61 | 0.014642 | 0.006774 | 0.006774 |
| 4 | 0 | 70 | 5.19 | 0.01097 | 0.004543 | 0.004543 |
| 3 | 0 | 70 | 4.17 | 0.01097 | 0.006162 | 0.006162 |
| 2 | 0 | 70 | 3.09 | 0.009119 | 0.005883 | 0.005883 |
| 1 | 0 | 75 | 2.7 | 0.009099 | 0.007517 | 0.007515 |
| 0 | 0 | 75 | 2 | 0.009099 | 0.009161 | 0.009161 |

TABLE 20-continued

| Diopter S | Diopter C | Lens diameter | Thickness | Front surface curvature (1/mm) | Rear surface curvature S axis (1/mm) | Rear surface curvature C axis (1/mm) |
|---|---|---|---|---|---|---|
| −1 | 0 | 75 | 1.5 | 0.009099 | 0.0010812 | 0.010812 |
| −2 | 0 | 75 | 1 | 0.009099 | 0.012463 | 0.012463 |
| −3 | 0 | 75 | 1 | 0.007281 | 0.012301 | 0.012301 |
| −4 | 0 | 75 | 1 | 0.007281 | 0.013968 | 0.013968 |
| −5 | 0 | 75 | 1 | 0.00532 | 0.013664 | 0.013664 |
| −6 | 0 | 75 | 1 | 0.00532 | 0.015331 | 0.015331 |
| −7 | 0 | 70 | 1 | 0.003612 | 0.015283 | 0.015283 |
| −8 | 0 | 70 | 1 | 0.003612 | 0.01695 | 0.01695 |

TABLE 21

| Diopter S | Diopter C | Necessary Abbe number (Clear visual area) | Necessary Abbe number (Quasi-clear visual area) |
|---|---|---|---|
| 8 | 0 | 79 | 27 |
| 7 | 0 | 51 | 21 |
| 6 | 0 | 59 | 20 |
| 5 | 0 | 36 | 15 |
| 4 | 0 | 36 | 13 |
| 3 | 0 | 21 | 9 |
| 2 | 0 | 13 | 6 |
| 1 | 0 | 7 | 4 |
| 0 | 0 | 2 | 1 |
| −1 | 0 | 4 | 2 |
| −2 | 0 | 9 | 5 |
| −3 | 0 | 15 | 7 |
| −4 | 0 | 20 | 10 |
| −5 | 0 | 29 | 13 |
| −6 | 0 | 33 | 15 |
| −7 | 0 | 44 | 19 |
| −8 | 0 | 46 | 21 |

Figure 11:
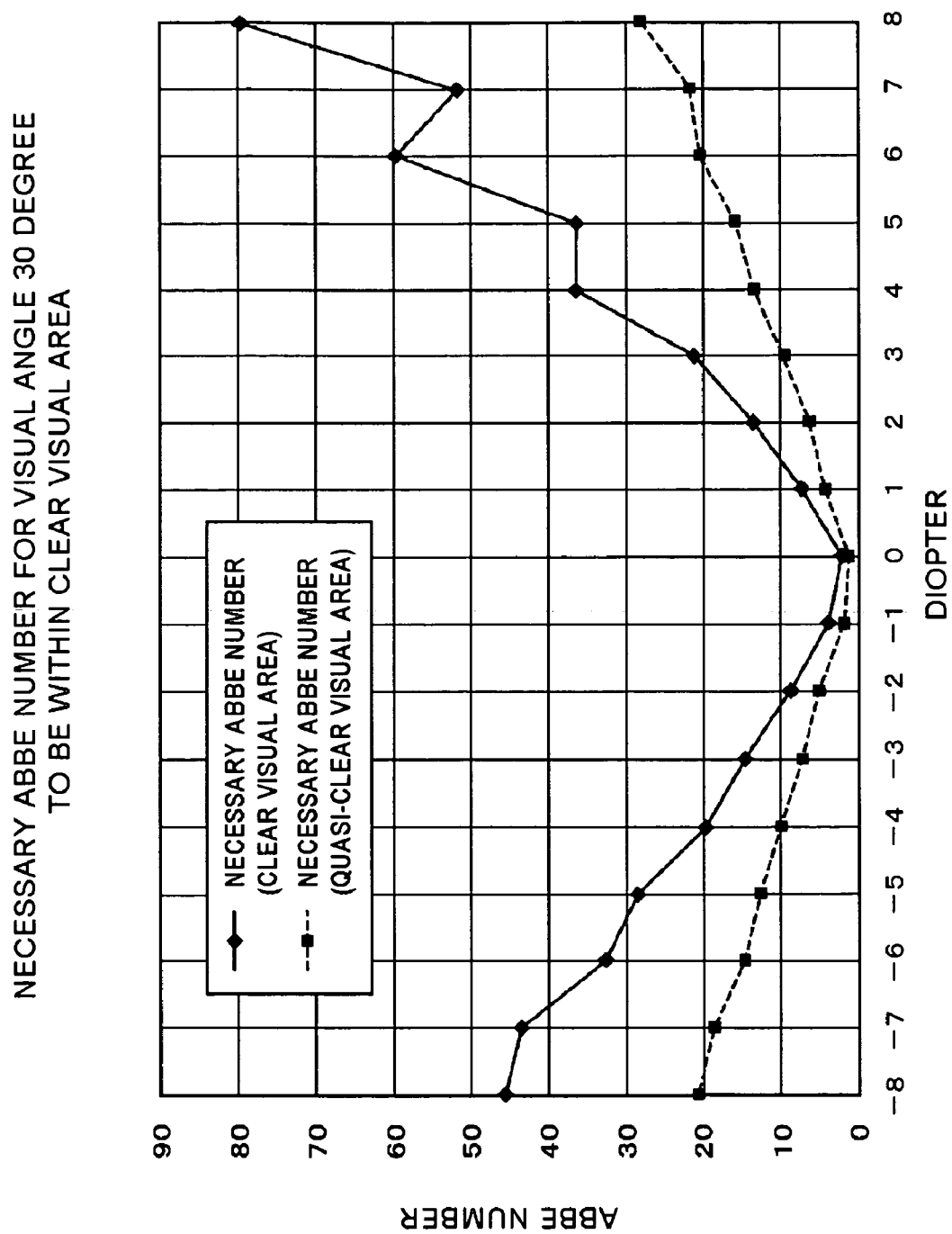
FIG. 11 is a view showing a relation between the Abbe number necessary for a visual angle 30° to be a clear visual area and a diopter.

FIG. 11, diopters are taken on the horizontal axis, and necessary Abbe numbers to be in the clear visual area at the visual angle of 30° (cycloduction angle of 15°) are taken on the vertical axis. As shown in FIG. 11, dependence of the necessary Abbe number on the lens diopters are presented quantitatively.

Further, from FIG. 11, it is perceived that, for example, the Abbe number 40 can satisfy the visual angle of 30° by approximately −6.5 [D] to +5 [D]. In Table 21, the vertical axis shows necessary Abbe numbers to be in a quasi-clear visual area at the visual angle of 30° (cycloduction angle of 15°). Here, the quasi-clear visual area is defined as a region in which the logMAR visual acuity is within 0.2.

As above, it has become clear that how much degree of the Abbe number is necessary for how much degree of the angle. Therefore, it can be said that the equation (7) becomes crucial judgment standard for the design of spectacle lenses and the development of materials.

EXAMPLE 3

Visual Acuity Evaluation at Visual Angle of 60° (Cycloduction Angle of 30°)

In many documents in the past, spectacle lenses are designed to have reduced aberrations at the cycloduction angle of 30°, or the cycloduction angle of 30° is used as a measure for correcting aberrations. From a viewpoint of visual acuity, performance evaluation at a visual angle of 60° is crucial. Accordingly, the various lens data of Table 20 are used as lens from data, and logMAR visual acuity at the visual angle of 60° (cycloduction angle of 30°) is calculated. Results of the calculation are shown in Table 22 and FIG. 12.

TABLE 22

| Diopter S | Diopter C | No chromatic aberration | Abbe number 60 | Abbe number 30 | Power error | Astigmatism |
|---|---|---|---|---|---|---|
| 8 | 0 | 0.21 | 0.36 | 0.51 | 0.23 | 0.75 |
| 7 | 0 | 0.12 | 0.25 | 0.38 | 0.04 | 0.48 |
| 6 | 0 | 0.21 | 0.32 | 0.43 | 0.28 | 0.67 |
| 5 | 0 | 0.11 | 0.21 | 0.3 | 0.11 | 0.42 |
| 4 | 0 | 0.19 | 0.26 | 0.34 | 0.28 | 0.54 |
| 3 | 0 | 0.1 | 0.16 | 0.22 | 0.13 | 0.32 |
| 2 | 0 | 0.08 | 0.12 | 0.16 | 0.12 | 0.24 |
| 1 | 0 | 0.02 | 0.05 | 0.07 | 0.02 | 0.08 |
| 0 | 0 | 0.01 | 0.02 | 0.02 | −0.02 | 0.02 |
| −1 | 0 | 0.02 | 0.04 | 0.05 | −0.03 | 0.08 |
| −2 | 0 | 0.02 | 0.05 | 0.09 | 0.01 | 0.09 |
| −3 | 0 | 0.04 | 0.09 | 0.14 | −0.02 | 0.17 |
| −4 | 0 | 0.04 | 0.11 | 0.18 | 0.04 | 0.15 |
| −5 | 0 | 0.06 | 0.15 | 0.24 | −0.03 | 0.26 |
| −6 | 0 | 0.06 | 0.16 | 0.27 | 0.05 | 0.21 |
| −7 | 0 | 0.08 | 0.21 | 0.34 | −0.04 | 0.34 |
| −8 | 0 | 0.07 | 0.22 | 0.36 | 0.05 | 0.26 |

Figure 12:
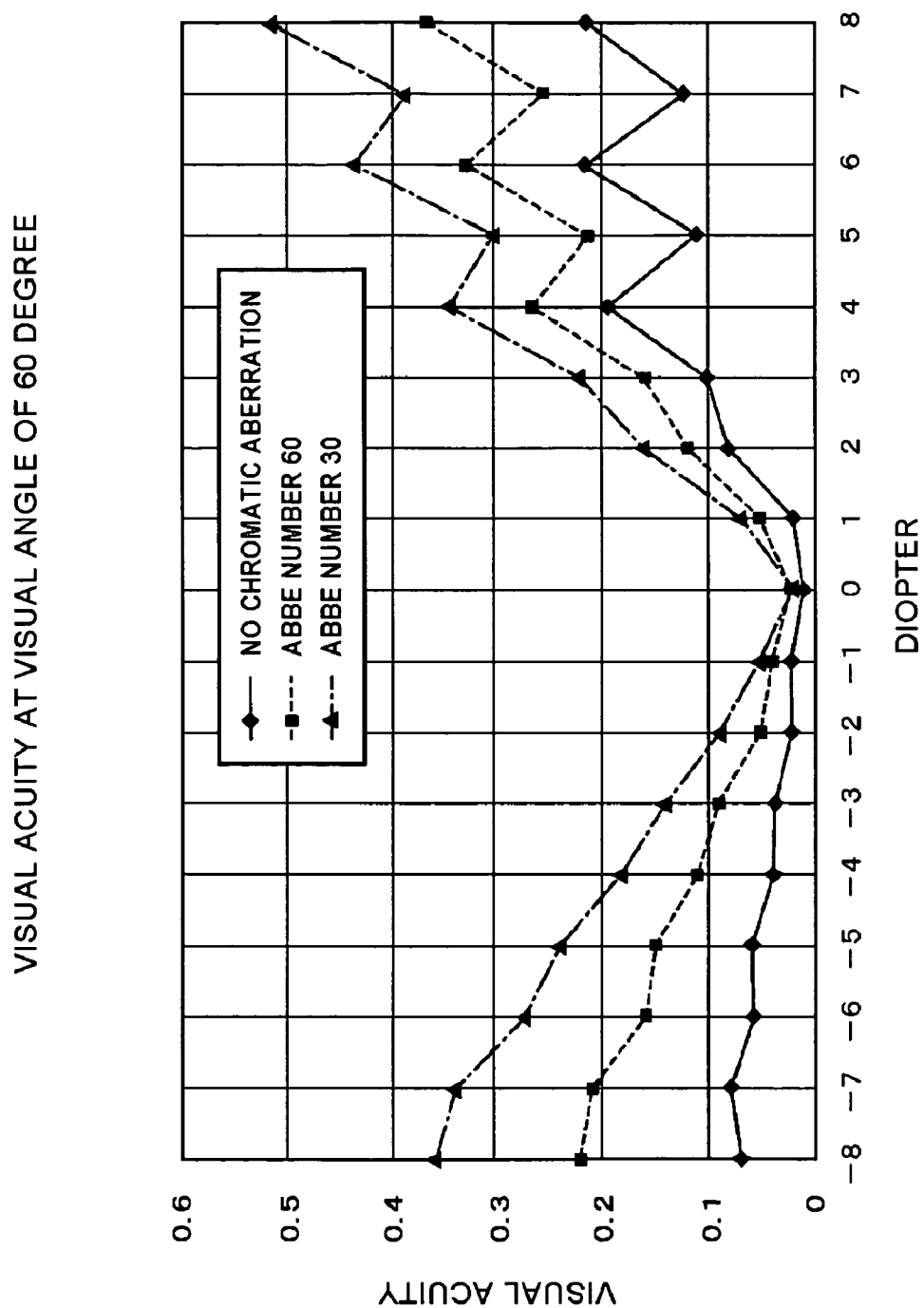
FIG. 12 is a view showing a logMAR visual acuity in the visual angle of 60° by each Abbe number.

From FIG. 12, in the case of no chromatic aberration, it is clearly understandable that the presented diopter range is substantial quasi-clear visual area. Here, the quasi-clear visual area is defined as a region in which the logMAR visual acuity is 0.2 or lower.

Further, when the Abbe number is 60, it is clearly understandable that the diopter minus range is the quasi-clear visual area.

Further, the data of the power error and the astigmatism in Table 16 are calculated as the power error and the astigmatism at the visual angle of 60° (cycloduction angle of 30°) using the data of the lens form of Table 14. It is proved from these data that the power error is equal to or lower than a diopter setting minimum unit of 0.25 [D], and the astigmatism, even though it is slightly large at +6 [D] or higher, satisfies the astigmatism of 0.5 [D] which is frequently used for spectacle lens design standards.

Specifically, for the presented diopter range (±8 [D] or less), both in judgement of the power error and the astigmatism which are conventionally the aberrations for correcting designs, and in the visual acuity function in the case that the chromatic aberration is not taken into consideration, it has not been clear that which design of diopter part is needed to be corrected.

However, in this example, by using this visual acuity function including the chromatic aberration, performance of a spectacle lens becomes clear, and corrective designing for the performance of the spectacle lens becomes very easy.

Further, from a viewpoint of performance correction of spectacle lenses, it is proved that the quasi-clear visual area is appropriate at a visual angle of 50°.

Further, although the expression of the clear visual diameter is used in this example, besides that, evaluation by a percentage rate of the clear visual area on a lens surface may be used, or the clear visual angle may be directly displayed to be evaluated.

Further, the visual acuity function may be improved in such a manner that the chromatic aberration is added to the above-described conventional art, "Measurement of visual acuity: a critical review, A. M. A. Arch. Ophthal" (45(6): 704-725, 1951), or to the one disclosed in Japanese Examined Patent Application No. Sho 42-9416 (or an improved one). In such cases, for example, the following visual acuity function can be derived.

$$\text{visual acuity function} = \log_{10}[1+2.8\times(\text{sphere error}+L\times\text{cyl error})]+\beta\times\text{chromatic aberration of magnification} \quad (c)$$

where, L is a coefficient within a range of $0.5 \leq L \leq 0.8$, and when a tangential error is denoted by T and a saggital error is denoted by S, the sphere error and the cyl error are expressed by the following equations (d) and (e) respectively:

$$\text{sphere error} = \min(|T|, |S|) \quad (d)$$

$$\text{cyl error} = ||T|-|S|| \quad (e)$$

INDUSTRIAL AVAILABILITY

According to the present invention, evaluation of an optical system with respect to visual acuity can be appropriately performed, with chromatic aberration of magnification of the optical system being taken into consideration. Furthermore, according to the present invention, an optical system can be appropriately designed while the chromatic aberration of magnification of the optical system is taken into consideration.

The invention claimed is:

1. A performance evaluation method of an optical system, comprising:
    evaluating a performance of the optical system based on a combination of a first deterioration amount and a second deterioration amount, a total deterioration amount of a visual acuity which is due to aberrations in the optical system, the total deterioration amount being a sum of the first and second deterioration amounts when the visual acuity is expressed as a logarithmic visual acuity, the first deterioration amount being only due to an aberration other than a chromatic aberration of magnification and the second deterioration amount being only due to the chromatic aberration of magnification.

2. The performance evaluation method of the optical system according to claim 1, wherein the performance of the optical system is evaluated using a visual acuity function that defines a value of the visual acuity based on the total deterioration amount by combining a first term for obtaining the first deterioration amount and a second term for obtaining the second deterioration amount.

3. The performance evaluation method of the optical system according to claim 2, wherein the visual acuity function includes a sum of the first term and the second term when the visual acuity is expressed by the logarithmic visual acuity.

4. The performance evaluation method of the optical system according to claim 3, wherein the second term includes a product of a parameter which expresses a value of the chromatic aberration of magnification and a predetermined proportional constant.

5. The performance evaluation method of the optical system according to claim 4, wherein the second term covers a range of the chromatic aberration of magnification in which the small field tritanopia phenomenon occurs.

6. The performance evaluation method of the optical system according to claim 3, wherein the first term includes a parameter which has a first value for a far region in a predetermined direction and a second value for a near region which is closer to an eyeball side than the far region in the direction, the first value and the second value being different values.

7. The performance evaluation method of the optical system according to claim 6, wherein the first term includes a parameter which expresses a power error, and a parameter which expresses an astigmatism or a residual astigmatism.

8. The performance evaluation method of the optical system according to claim 6, further comprising:
    setting plural evaluation points in advance on a surface of an optical element which forms the optical system, where a ray is capable of passing through the surface; and
    evaluating the performance of the optical system based on 1) a merit function; or 2) a function which is substantially equivalent to the merit function, the merit function being expressed as:

$$\text{merit function} = a \times \sum_{n=1}^{m} (u_n \cdot \text{far vision}_n)^2 + b \sum_{n=1}^{m} (v_n \cdot \text{near vision}_n)^2 + c \times \sum_{n=1}^{m} (w_n \cdot DIST_n)^2 \quad (f)$$

where: m is a natural number expressing a number of evaluation points; the far vision$_n$ is a value of the visual acuity function at an n$^{th}$ evaluation point when looking the far region; the near vision$_n$ is a value of the visual acuity function at the n$^{th}$ evaluation point when looking in the near region; DIST$_n$ is a value of a distortion aberration at the n$^{th}$ evaluation point; a, b, c are predetermined coefficients; u$_n$, v$_n$, w$_n$ are coefficients of the n$^{th}$ evaluation point.

9. The performance evaluation method of the optical system according to claim 6, further comprising:

setting plural evaluation points in advance on a surface of an optical element which forms the optical system, where a ray being capable of passing through the surface; and evaluating the performance of the optical system based on 1) a merit function, or 2) a function which is substantially equivalent to the merit function, the merit function being expressed as:

$$\text{merit function} = a \times \sum_{n=1}^{m} (u_n \cdot \text{far vision}_n)^2 + b \sum_{n=1}^{m} (v_n \cdot \text{near vision}_n)^2 + c \times \sum_{n=1}^{m} (w_n \cdot \text{residual DIST}_n)^2 \quad (g)$$

where: m is a natural number expressing a number of evaluation points; the far vision$_n$ is a value of the visual acuity function at an n$^{th}$ evaluation point when looking in the far region; the near vision$_n$ is a value of the visual acuity function at the n$^{th}$ evaluation point when looking in the near region; residual DIST$_n$ is a value of a distortion aberration at the n$^{th}$ evaluation point; a, b, c are predetermined coefficients; u$_n$, v$_n$, w$_n$, are coefficients of the n$^{th}$ evaluation point.

10. The performance evaluation method of the optical system according to claim 3, wherein the visual acuity function is expressed as:

visual acuity function=α×[(power error)$^2$+(K×astigmatism)$^2$]$^{1/2}$+β×chromatic aberration of magnification, where: α is a coefficient within a range of 0.25≦α≦0.65, β is a coefficient within a range of 0.2≦β≦1.2, and K is a coefficient within a range of 0.2≦K<1.

11. The performance evaluation method of the optical system according to claim 3, wherein the visual acuity function is expressed as:

visual acuity function=α×[(power error)$^2$+(K×residual astigmatism)$^2$]$^{1/2}$+β×chromatic aberration of the magnification, where: α is a coefficient within a range of 0.25≦α≦0.65, β is a coefficient within a range of 0.2≦β≦1.2, and K is a coefficient within a range of 0.2≦K<1.

12. The performance evaluation method of the optical system according to claim 3, wherein the visual acuity function is expressed as:

visual acuity function=log$_{10}$[1+2.8×(sphere error+L× cyl error)]+β×chromatic aberration of magnification, where: L is a coefficient within a range of 0.5≦L≦0.8, and when a tangential error is denoted by T and a sagittal error is denoted by S:

sphere error=min (|T|, |S|), cyl error=||T|−|S||.

13. The performance evaluation method of the optical system according to claim 1, further comprising:

setting plural evaluation points in advance on a surface of an optical element which forms the optical system, where a ray is capable of passing through the surface; and evaluating the performance of the optical system at each of the evaluation points.

14. A designing method of an optical system comprising the performance evaluation method according to claim 1.

15. The designing method according to claim 14, further comprising:

changing a value of a variable parameter by predetermined steps;

evaluating a visual acuity of a virtual optical element which is defined by a value of the variable parameter and a value of a fixed parameter for each of the predetermined steps based on an evaluation of the performance evaluation method of claim 1; and specifying an optimum value of the variable parameter that corresponds to a predetermined step in which the evaluation becomes optimum.

16. The designing method according to claim 15, wherein the variable parameter includes a chromatic aberration of magnification of the optical system or an optical value of the optical system that corresponds to the chromatic aberration of magnification.

17. An optical system which is manufactured using the designing method of the optical system according to claim 14.

* * * * *